United States Patent
Jeon

(10) Patent No.: US 7,907,373 B2
(45) Date of Patent: Mar. 15, 2011

(54) ELECTROSTATIC DISCHARGE CIRCUIT

(75) Inventor: Chan-hee Jeon, Gyeonggi-Do (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 376 days.

(21) Appl. No.: 11/226,193

(22) Filed: Sep. 15, 2005

(65) Prior Publication Data

US 2006/0189189 A1   Aug. 24, 2006

(30) Foreign Application Priority Data

Feb. 24, 2005  (KR) .................. 10-2005-0015543

(51) Int. Cl.
*H02H 9/00* (2006.01)
*H02H 3/22* (2006.01)
(52) U.S. Cl. ........................................ 361/56; 361/111
(58) Field of Classification Search .............. 361/56, 361/111
See application file for complete search history.

(56) References Cited

U.S. PATENT DOCUMENTS

| | | | | |
|---|---|---|---|---|
| 6,144,542 A * | 11/2000 | Ker et al. | ...................... | 361/111 |
| 6,963,112 B2 * | 11/2005 | Chen | .............................. | 257/365 |
| 7,072,158 B2 * | 7/2006 | Wang | ............................... | 361/56 |
| 7,106,562 B2 * | 9/2006 | Kitagawa | ........................ | 361/56 |
| 7,385,253 B2 * | 6/2008 | Kim | ................................ | 257/356 |
| 2002/0181177 A1 * | 12/2002 | Ker et al. | ........................ | 361/56 |
| 2004/0251502 A1 | 12/2004 | Reddy et al. | | |
| 2006/0065932 A1 * | 3/2006 | Huang et al. | .................. | 257/355 |

OTHER PUBLICATIONS

Dutch Search Report dated Sep. 27, 2007 for corresponding Dutch Patent Application.

* cited by examiner

*Primary Examiner* — Jared Fureman
*Assistant Examiner* — Lucy Thomas
(74) *Attorney, Agent, or Firm* — Harness, Dickey & Pierce, P.L.C.

(57) ABSTRACT

An electrostatic discharge circuit, connected between at least three terminals, the electrostatic discharge circuit including at least one electrostatic discharge circuit element further including at least one circuit element including a body in a floating state. The body in a floating state may provide a path to discharge an electrostatic current. The electrostatic discharge circuit may be a pull-up circuit, a plurality of pull-up circuits, a pull-down circuit, a plurality of pull-down circuits, a power clamp, a plurality of power clamps, or other similar circuit or circuits. The at least three terminals may include one or more power terminals, one or more ground terminals, and/or one or more I/O terminals.

30 Claims, 20 Drawing Sheets

ELECTROSTATIC DISCHARGE CIRCUIT

PRIORITY STATEMENT

This U.S. non-provisional application claims priority under 35 U.S.C. §119 to Korean Patent Application No. 2005-0015543, filed on Feb. 24, 2005, the entire contents of which are incorporated by reference.

BACKGROUND OF THE INVENTION

A well-known cause of failure in electronic integrated circuits is exposure to large and/or sudden electrostatic discharge (ESD). A built-up electrostatic charge may be quickly discharged when the charged device comes into contact with an integrated circuit, for example, when portions of the circuit are connected to power supplies, including ground. The discharge can cause damage to the integrated circuit as a result of dielectric breakdown of oxides and/or other thin films, and also by higher levels of conduction through relatively small areas of the integrated circuit arising from reverse breakdown of p-n junctions on the circuit.

Electrostatic discharge (ESD) may have an effect on the reliability of integrated circuits. Further, as the size of integrated circuits is reduced, ESD tolerance may also be reduced. In particular, as a result of higher current density and lower voltage tolerance, as ICs become smaller and/or faster, the susceptibility of their protection circuits to damage may increase. Further, as lightly doped drain (LDD) regions become shallower than source/drain diffusion regions, for a given current level, there may be a greater current density in the LDD region, which means there may be more localized heating. Still further, silicided source/drain diffusion areas may also lead to current localization by concentrating current flow at the surface of devices, as well as, reducing the ballasting resistance needed to distribute the current. Additionally, thinner gate oxides of MOS transistors may be more susceptible to high-field stress, for example, dielectric breakdown.

In particular, in a mixed-voltage application, some components or integrated circuits may operate at a lower voltage level, while other peripheral components or other integrated circuits may operate at a higher voltage level. As a result, there may be chips with different power supply voltages coexisting in the same system. Input/output (I/O) circuits may be designed to be tolerant of various input voltages. Further, chip-to-chip interface I/O circuits, including ESD protection circuits, may be designed to avoid electrical overstress on the transistors and/or to reduce or prevent undesirable leakage current paths between the chips.

As an example, a conventional power clamp may be used to ensure than an ESD path between a supply voltage VDD and a ground voltage VSS, is triggered by an ESD event. For voltages higher than the supply voltage VDD or lower than the ground voltage VSS, the power clamp may provide a discharge path, for example, to ground.

Conventional power clamps include MOS transistors, NPN, PNP bipolar transistors, diodes, thyristors, or field transistors. In order to discharge ESD events without damaging an internal circuit or the ESD protection circuit itself, an ESD protection scheme should have a low voltage turn-on and high current drive. In particular, if the first breakdown voltage or trigger voltage is higher than the breakdown voltage of the gate dielectric of a MOS transistor, the ESD protection scheme may fail to protect the internal circuit and the internal circuit may be destroyed. Further, if a response time of the ESD triggering is delayed, the ESD protection scheme may fail to protect a high speed or higher frequency integrated circuit, due to an initial build-up of high voltage or large current.

SUMMARY OF THE INVENTION

Example embodiments of the present invention are directed to an electrostatic discharge circuit and methods for dissipating an electrostatic current.

Example embodiments of the present invention are directed to an electrostatic discharge circuit, connected between at least three terminals, the electrostatic discharge circuit including at least one electrostatic discharge circuit element further including at least one circuit element including a body in a floating state. The body in a floating state may provide a path to discharge an electrostatic current. The electrostatic discharge circuit may be a pull-up circuit, a plurality of pull-up circuits, a pull-down circuit, a plurality of pull-down circuits, a power clamp, a plurality of power clamps, or other similar circuit or circuits. The at least three terminals may include one or more power terminals, one or more ground terminals, and/or one or more I/O terminals.

Example embodiments of the present invention are directed to an electrostatic discharge circuit, with a lower trigger voltage and/or a faster reaction time.

Example embodiments of the present invention are directed to an electrostatic discharge circuit, connected between at least three terminals the electrostatic discharge circuit including at least one electrostatic discharge circuit element further including at least one circuit element, including a body in a floating state.

In example embodiments of the present invention, the at least three terminals include at least one power terminal and at least one ground terminal.

In example embodiments of the present invention, the at least one electrostatic discharge circuit element includes at least one power clamp.

In example embodiments of the present invention, the at least one power clamp includes one power clamp, connected between one of the at least one power terminals and two or more of the at least one ground terminals.

In example embodiments of the present invention, the at least one power clamp includes a plurality of power clamps, connected between one of the at least one power terminals and two or more of the at least one ground terminals.

In example embodiments of the present invention, each of the plurality of power clamps are connected between the same one of the at least one power terminals and the same two or more of the at least one ground terminals.

In example embodiments of the present invention, each of the plurality of power clamps are connected between the same one of the at least one power terminals and one of the two or more of the at least one ground terminals.

In example embodiments of the present invention, the at least one power clamp includes one power clamp, connected between two or more of the at least one power terminals and one of the at least one ground terminals.

In example embodiments of the present invention, the at least one power clamp includes a plurality of power clamps, connected between two or more of the at least one power terminals and one of the at least one ground terminals.

In example embodiments of the present invention, each of the plurality of power clamps are connected between the same one of the at least one ground terminals and the same two or more of the at least one power terminals.

In example embodiments of the present invention, each of the plurality of power clamps are connected between the same one of the at least one ground terminals and one of the two or more of the at least one power terminals.

In example embodiments of the present invention, the at least three terminals include at least one ground terminal and at least one input/output terminal.

In example embodiments of the present invention, the at least one electrostatic discharge circuit element includes at least one pull-down circuit.

In example embodiments of the present invention, the at least one pull-down circuit includes a pull-down circuit, connected between one of the at least one input/output terminals and two or more of the at least one ground terminals.

In example embodiments of the present invention, the electrostatic discharge circuit further comprises a pull-up circuit, connected between one of at least one power terminals and one of the at least one input/output terminals.

In example embodiments of the present invention, the at least one pull-down circuit includes a plurality of pull-down circuits connected between a plurality of input/output terminals and two or more of the at least one ground terminals.

In example embodiments of the present invention, each of the plurality of pull-down circuits are connected between a different one of the plurality of input/output terminals and the same two or more of the at least one ground terminals.

In example embodiments of the present invention, each of the plurality of pull-down circuits are connected between a different one of the plurality of input/output terminals and one of the two or more of the at least one ground terminals.

In example embodiments of the present invention, the electrostatic discharge circuit further comprises a plurality of pull-up circuits, connected between one of at least one power terminals and the plurality of input/output terminals.

In example embodiments of the present invention, the at least three terminals include at least one power terminal and at least one input/output terminal.

In example embodiments of the present invention, the at least one electrostatic discharge circuit element includes at least one pull-up circuit.

In example embodiments of the present invention, the at least one pull-up circuit includes a pull-up circuit, connected between one of the at least one input/output terminals and two or more of the at least one power terminals.

In example embodiments of the present invention, the electrostatic discharge circuit further comprises a pull-down circuit, connected between one of the at least one input/output terminals and one of at least one ground terminals.

In example embodiments of the present invention, the at least one pull-up circuit includes a plurality of pull-up circuits between a plurality of input/output terminals and two or more of the at least one power supply terminals.

In example embodiments of the present invention, each of the plurality of pull-up circuits are connected between a different one of the plurality of input/output terminals and the same two or more of the at least one power terminals.

In example embodiments of the present invention, each of the plurality of pull-up circuits are connected between a different one of the plurality of input/output terminals and one of the two or more of the at least one power terminals.

In example embodiments of the present invention, the electrostatic discharge circuit further comprises a plurality of pull-down circuits connected between the plurality of input/output terminals and one of the at least one ground terminals.

In example embodiments of the present invention, the at least three terminals include at least one power terminal, at least one ground terminal, and at least one input/output terminal.

In example embodiments of the present invention, the at least one electrostatic discharge circuit element includes at least one pull-down circuit and at least one pull-up circuit.

In example embodiments of the present invention, the at least one pull-down circuit includes a pull-down circuit connected between one of the at least one input/output terminals and two or more of the at least one ground terminals and the at least one pull-up circuit includes a pull-up circuit, connected between one of the at least one input/output terminals and two or more of the at least one power terminals.

In example embodiments of the present invention, the at least one pull-down circuit includes a plurality of pull-down circuits connected between a plurality of input/output terminals and two or more of the at least one ground terminals and the at least one pull-up circuit includes a plurality of pull-up circuits connected between plurality of input/output terminals and two or more of the at least one power terminals.

In other example embodiments of the present invention, transistors of an ESD portion of a power clamp are connected to separate ground voltage supply lines.

In other example embodiments of the present invention, transistors of an ESD portion of a power clamp are connected to separate power supply lines.

In other example embodiments of the present invention, transistors of an ESD portion of a pull-up device are connected to separate power supply lines.

In other example embodiments of the present invention, transistors of an ESD portion of a pull-down device are connected to separate ground voltage supply lines.

In other example embodiments of the present invention, transistors of an ESD circuit coupled to an I/O pad are connected to separate ground voltage supply lines.

In other example embodiments of the present invention, transistors of an ESD circuit coupled to an I/O pad are connected to separate power supply lines.

BRIEF DESCRIPTION OF THE DRAWINGS

The present invention will become more fully understood from the detailed description of example embodiments provided below and the accompanying drawings, which are given for purposes of illustration only, and thus do not limit the invention.

It should be noted that these Figures are intended to illustrate the general characteristics of methods and devices of example embodiments of this invention, for the purpose of the description of such example embodiments herein. These drawings are not, however, to scale and may not precisely reflect the characteristics of any example embodiment, and should not be interpreted as defining or limiting the range of values or properties of example embodiments within the scope of this invention.

DETAILED DESCRIPTION OF EXAMPLE EMBODIMENTS

Figure 1:
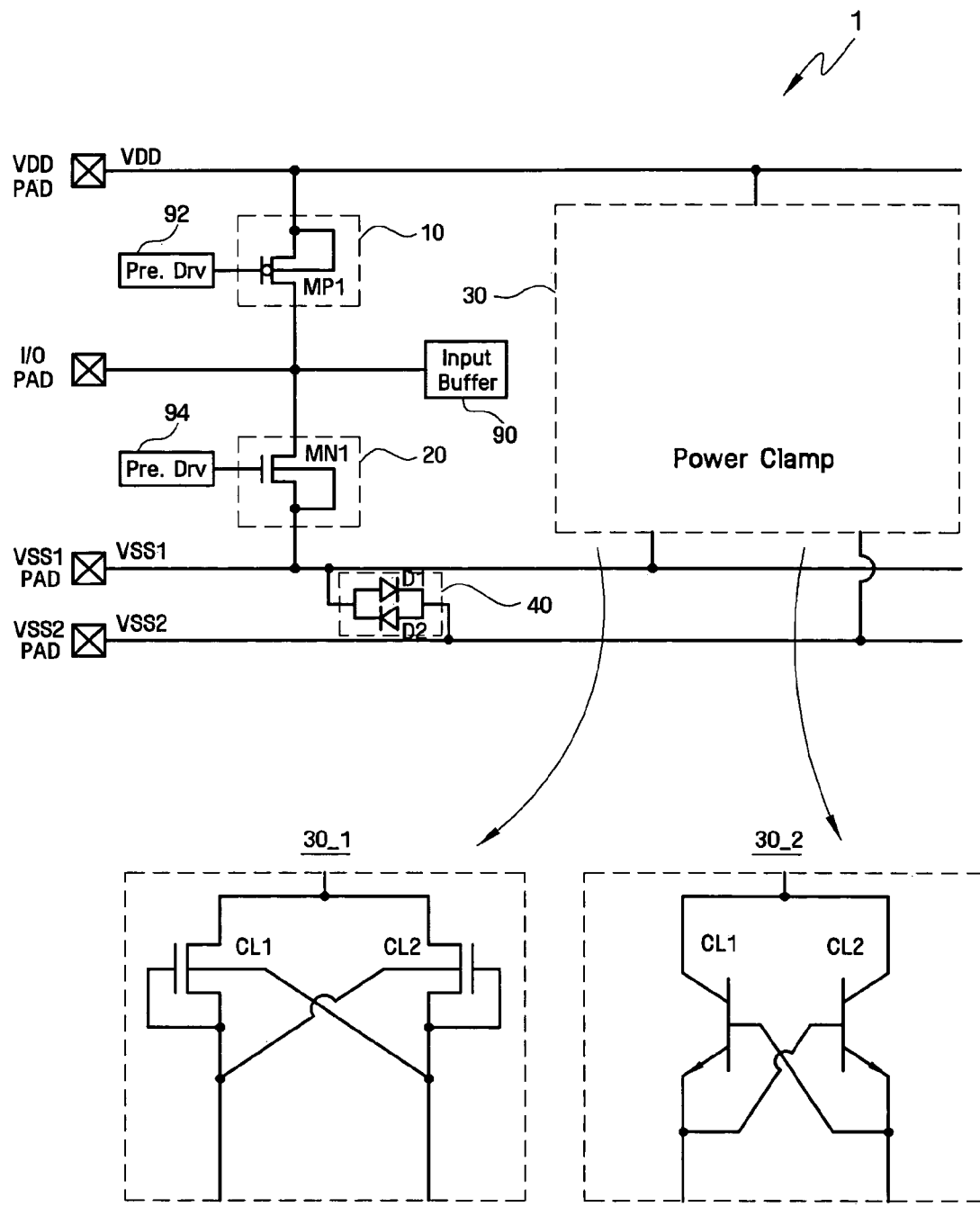
FIG. 1 illustrates an electrostatic discharge circuit in accordance with an example embodiment of the present invention.

FIG. 1 illustrates an electrostatic discharge circuit in accordance with an example embodiment of the present invention.

As shown in FIG. 1, the example electrostatic discharge circuit 1 may include a pull-up device 10, a pull-down device 20, a power clamp 30, and/or a transfer circuit 40. The electrostatic discharge device 1 may be connected to a supply voltage, for example, a VDD pad or VDD terminal, which may supply a positive supply voltage, for example, a VDD signal, an I/O pad or I/O terminal, which may supply an I/O signal, and at least one ground or reference supply voltage, for example, a VSS pad or VSS terminal, for example, VSS1 pad and VSS2 pad, which may supply VSS1 and VSS2 signals, respectively.

In another example embodiment, the electrostatic discharge device 1 may further include a pre-driver 92 connected to the pull-up device 10 and/or a pre-driver 94 connected to the pull-down device 20, and/or an input buffer 90. As shown in FIG. 1, the I/O pad may be connected to internal logic or other internal circuitry of the electrostatic discharge circuit 1 through the input buffer 90. In example embodiments, the pre-driver 92 and the pre-driver 94 are the same circuit and provide the same signal.

In another example embodiment, the pull-up device 10 may include a p-channel MOSFET MP1, connected from a power supply line, for example, VDD, to the I/O pad. The p-channel MOSFET MP1 may have its gate coupled to the pre-driver circuit 92.

In another example embodiment, the pull-down device 20 may include an n-channel MOSFET MN1, connected from the I/O pad to a ground voltage supply line, for example, either VSS1 or VSS2. The n-channel MOSFET MN1 may have its gate coupled to the pre-driver circuit 94.

In an example embodiment, the power clamp 30 may be positioned between the VDD line and the one or more VSS lines. In an example embodiment, the power clamp 30 may include one or more clamp devices, for example, a first clamp device CL1 and a second clamp device CL2.

In an example embodiment, the first clamp device CL1 may be connected between VDD and VSS1 and/or VSS2 and the second clamp device CL2 may be connected between VDD and VSS1 and/or VSS2.

As shown in FIG. 1, the power clamp 30 may be implemented in several different ways, for example, as shown by power clamp 30-1 and power clamp 30-2. As illustrated, for example, power clamp 30-1 or power clamp 30-2 may include various arrangements of NMOSFET transistors, PMOSFET transistors and/or NPN, PNP bipolar transistors.

As illustrated, power clamp 30-1 may include a first NMOSFET transistor CL1 and a second NMOSFET transistor CL2. In an example embodiment, NMOSFET transistor CL1 may be connected from the VDD line to a first ground voltage supply line VSS1, which has a gate connected to VSS1 and a body connected to VSS2. In an example embodiment of the present invention, the second NMOSFET CL2 may be connected from the VDD line to the second ground voltage supply line VSS2, which has a gate connected to VSS2 and a body connected to VSS1.

In another example embodiment, the power clamp 30 may be implemented as power clamp 30-2, including a first NPN bipolar transistor CL1 and a second NPN bipolar transistor CL2. In an example embodiment, the emitter of the first NPN bipolar transistor CL1 may be connected to a first ground voltage supply line VSS1 and further connected to the base of CL2. The collector of the first NPN bipolar transistor CL1 may be connected to VDD. In an example embodiment, the emitter of the second NPN bipolar transistor CL2 may be connected to a second ground voltage supply line VSS2 and further connected to the base of the first NPN bipolar transistor CL1. The collector of the second NPN bipolar transistor CL2 may be connected to VDD.

In an example embodiment, the transfer circuit 40 may electrically isolate the first ground voltage supply line VSS1 from the second ground voltage supply line VSS2 during normal operation and transfer an abnormal charge from one ground voltage supply line to the other ground voltage supply line during an ESD event.

Figure 2:
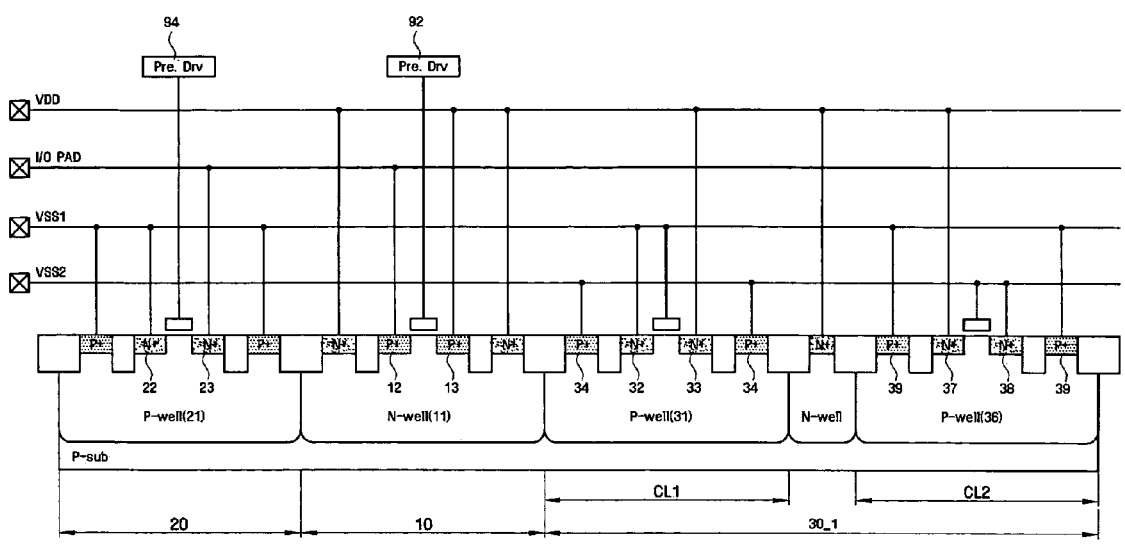
FIG. 2 illustrates a vertical profile of the electrostatic discharge circuit of FIG. 1, in accordance with an example embodiment of the present invention.
Figure 3:
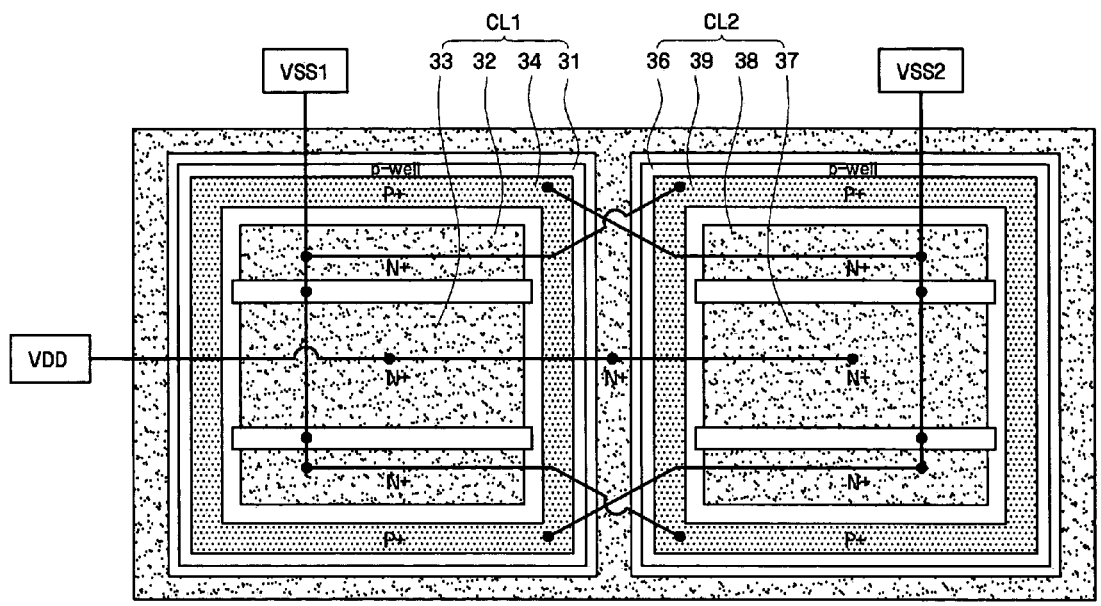
FIG. 3 illustrates an example layout of the electrostatic discharge circuit of FIG. 1, in accordance with an example embodiment of the present invention.

FIG. 2 illustrates an example vertical profile and FIG. 3 illustrates an example layout of the electrostatic discharge circuit of FIG. 1, respectively. In particular, FIG. 2 illustrates the pull-up device 10, the pull-down device 20, and the power clamp 30-1 of FIG. 1. As shown in FIG. 2, MP1 of the pull-up device 10 may include an N-well 11, a P+ source 12, and a P+ drain 13, and a gate connected to the pre-driver 92. Similarly, MN1 of the pull-down device 20 may include a P-well 21, an N+ source 22, an N+ drain 23, and a gate connected to the pre-driver 94.

As illustrated, the power clamp 30-1 may include the first NMOSFET transistor CL1, the second NMOSFET transistor CL2, and an N-well therebetween. More particularly, the first NMOSFET CL1 transistor may include a P-well 31, an N+ source 32, an N+ drain 33, and a P+ base contact 34. Similarly, the second NMOSFET CL2 may include a P-well 36, an N+ drain 37, an N+ source 38, and a P+ base contact 39.

As shown in FIG. 2, the first NMOSFET CL1 may be implemented as an NMOS transistor in a P-well 31, with its gate connected to VSS1, its drain connected to VDD, and its body connected to VSS2. Similarly, the second NMOSFET CL2 may be implemented as an NMOS transistor in a P-well 36, with its gate connected to VSS2, its drain connected to VDD, and its body connected to VSS1. As described above, in an example embodiment, the P-wells 31 and 36 may be isolated from each other with the N-well.

During normal operation mode of the electrostatic discharge circuit of FIG. 1, the p-channel MOSFET MP1 of the pull-up device 10 and the n-channel MOSFET MN1 of the pull-down device 20 may perform the function of an output buffer. In particular, a signal from the pre-driver circuit 92 may be applied to the gate of the pull-up transistor MP1 and a signal from the pre-driver circuit 94 may be applied to the gate of the pull-down transistor MN1. If the signal from the pre-driver circuit 92/94 is high, the pull-up transistor MP1 is turned off, the pull-down transistor MN1 is turned on, and the voltage VSS is transferred to the I/O pad. If the signal from the pre-driver circuit 92/94 is low, the pull-up transistor MP1 is turned on, the pull-down transistor MN1 is turned off, and VDD is transferred to the I/O pad. In this manner, the pre-driver circuit 92/94 may bias the gates of both the pull-up and pull-down transistors MP1, MN1 to supply VDD or VSS to the I/O pad. In normal operation, the power clamp 30 and the transfer circuit 40 need not operate.

Figure 4:
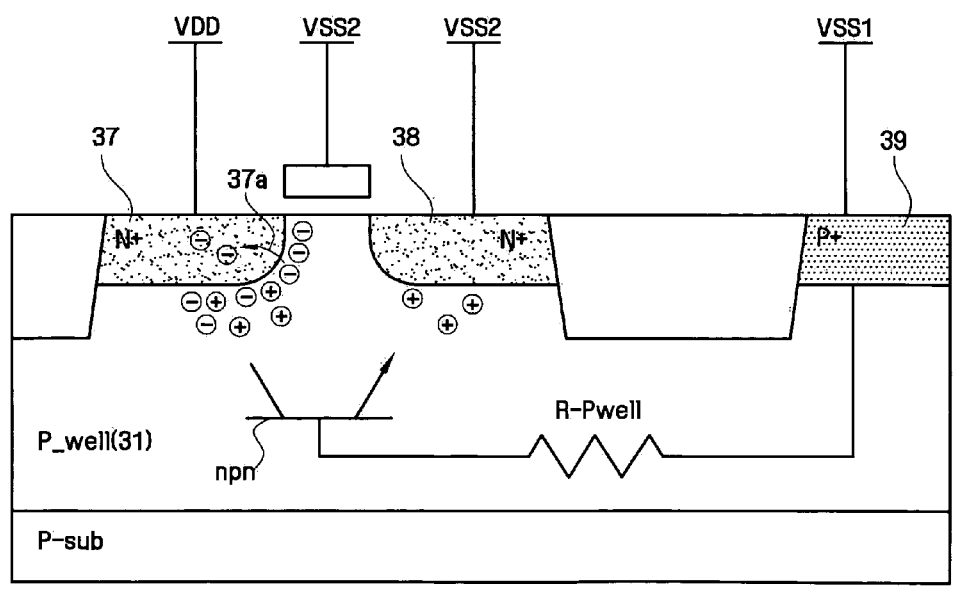
FIG. 4 illustrates an example of the operation of the electrostatic discharge circuit of FIG. 1 during an ESD event, in accordance with an example embodiment of the present invention.

During an ESD event, a large amount of ESD current may be supplied, which includes electron-hole-pairs (EHP) 37a near the junction between the N+ drain 37 and the P-well 31, as shown in FIG. 4. In a conventional ESD device, a hole current may be generated from the EHP near the N+ drain 37, drifting through the effective substrate resistance (R-Pwell) to ground, but in example embodiments of the present invention, the holes generated from the EHP near the N+ drain 37 may be accumulated between the N+ drain 37 and P-well 31. A hole current and accumulated holes may elevate the substrate potential. The emitter-base junction of the NPN may begin to forward bias to turn on the parasitic NPN bipolar transistors in the power clamp 30. This may be referred to as the first breakdown (Vt1, It1) and is shown in the voltage versus current plot of FIG. 5.

The parasitic bipolar transistor CL2 may operate between the N+ drain 37 and the N+ source 38. These areas may act as a bipolar collector and emitter, respectively. Current through the bipolar transistor may act as a "seed current" to drive a significant increase at the emitter-base junction of the NPN bipolar transistors. This may be referred to as a snapback mechanism, which is shown as (Vsp) in FIG. 5. The circuit may permit a large flow of current to the ground VSS using parasitic bipolar transistors in the power clamp 30, to thereby protect the integrated circuit.

Figure 5:
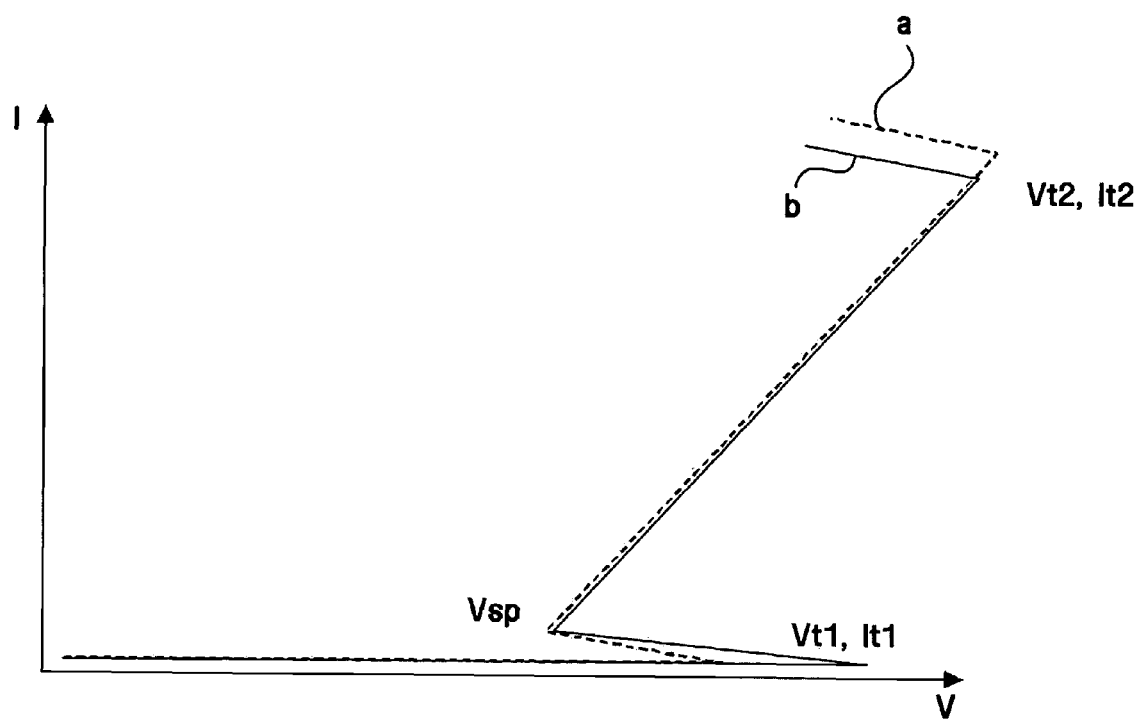
FIG. 5 illustrates a voltage versus current plot of the electrostatic discharge circuit of FIG. 1, in accordance with an example embodiment of the present invention.

At high stress levels, the device may go into thermal breakdown or second breakdown, which is shown at (Vt2, It2) in FIG. 5. The device temperature may increase to such a level that thermal carrier generation is high enough to dominate the conduction process. The second breakdown may be a positive feedback process that causes device failure due to current localization.

During an ESD event, there are four possible scenarios:
1) a positive ESD on a VDD pad, where VSS2 is the reference voltage;
2) a negative ESD on a VDD pad, where VSS1 is the reference voltage;
3) a positive ESD on an I/O pad, where VSS1 is the reference voltage; and
4) a negative ESD on an I/O pad, where VSS2 is the reference voltage. Each of these cases will be discussed below.

In Case 1, in a conventional ESD device (shown as curve b in FIG. 5), where VSS1 and VSS2 are the same, because both the P+ base contact 39 and the N+ source 38 are connected to a common VSS (effectively connected to a common ground voltage), a portion of the hole current generated from the EHP near the drain drifts out though the effective substrate resistance (R-Pwell) and the P+ base contact 39 contacts ground VSS1.

In contrast, in an example embodiment of the present invention (shown as curve a in FIG. 5), VSS1 is allowed to float, whereas VSS2 is tied to a ground voltage. Because the P-well 31 is in a floating state, the hole current generated from the EHP near the drain does not drift, and the potential of the base (P-well 31) of the parasitic NPN bipolar transistor increases more rapidly than in a conventional ESD circuit. As a result, the emitter 38/base 31 junction begins to forward bias, and then, turns on the bipolar transistor more quickly, which results in a drop of Vt1.

Even though the MOS transistors in the power clamp 30 may be formed of an array type, all parasitic bipolar transistors turn on simultaneously regardless of the effective substrate resistance (R-Pwell), because the distance between the source and drain of each transistor is the same. As a result, It2 increases.

In an example embodiment of the present invention, in Case 2, VSS2 is allowed to float and VSS1 is tied to ground voltage. Further, the junction between the drain 37 connected to VDD and the P-well 36 connected to the ground in CL2 of the power clamp 30 begins to forward bias to turn on the forward diode between the drain 37 and the P-well 36. As a result, an additional diode is not needed for discharging a negative ESD.

In an example embodiment of the present invention, in Case 3, VSS2 is again allowed to float and VSS1 is again tied to ground voltage. Further, the route for discharging ESD current includes pull-up device 10, the VDD line, the power clamp 30, and VSS1. Similarly, in Case 4, the route for discharge is the pull-down device 20 to the VSS line 1, to the transfer circuit 40, to VSS2. In Case 4, VSS1 is allowed to float and VSS2 is tied to ground voltage.

Figure 6A:
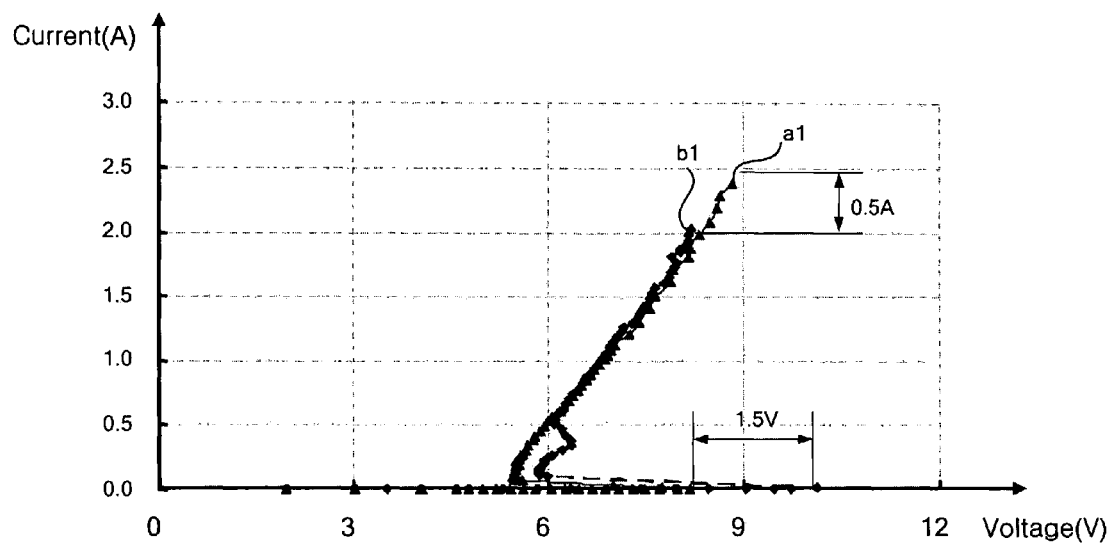
FIG. 6*a* illustrates a comparison of transmission line pulse (TLP) curves for a conventional low voltage NPN bipolar transistor (LVNPN) power clamp and a LVNPN power clamp in accordance with an example embodiment of the present invention.
Figure 6B:
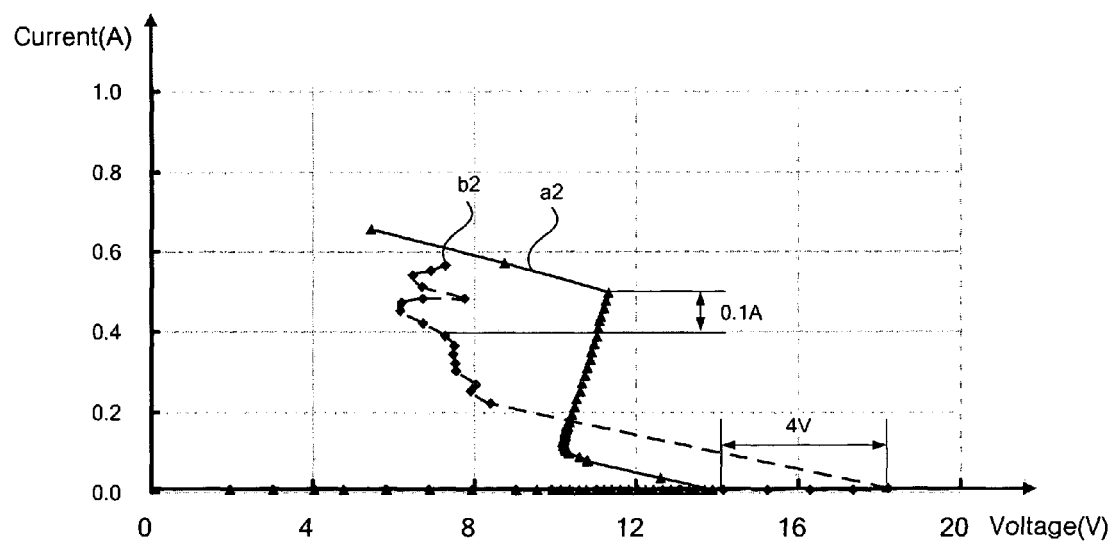
FIG. 6*b* illustrates a comparison of transmission line pulse (TLP) curves for a conventional high voltage NPN bipolar transistor (HVNPN) power clamp and a HVNPN power clamp in accordance with an example embodiment of the present invention.

FIG. 6a illustrates a comparison of transmission line pulse (TLP) curves for a conventional low voltage NPN bipolar transistor (LVNPN) power clamp and a LVNPN power clamp in accordance with an example embodiment of the present invention. FIG. 6b illustrates a comparison of transmission line pulse (TLP) curves for a conventional high voltage NPN bipolar transistor (HVNPN) power clamp and a HVNPN power clamp in accordance with an example embodiment of the present invention. As shown in FIG. 6a, curve a1 illustrates an example embodiment of the present invention, where one of the source and the body are floating and the other of the source and the body is connected to a reference voltage. Similarly, curve a2 illustrates an example embodiment of the present invention, where one of the source and the body are floating and the other of the source and the body is connected to a reference voltage.

As shown in FIG. 6a, curve a1 exhibits a lower Vt1 voltage and a higher It2 current than curve b1. As shown in FIG. 6b, curve a2 also exhibits a lower Vt1 voltage and a higher It2 current than curve b2.

Figure 7:
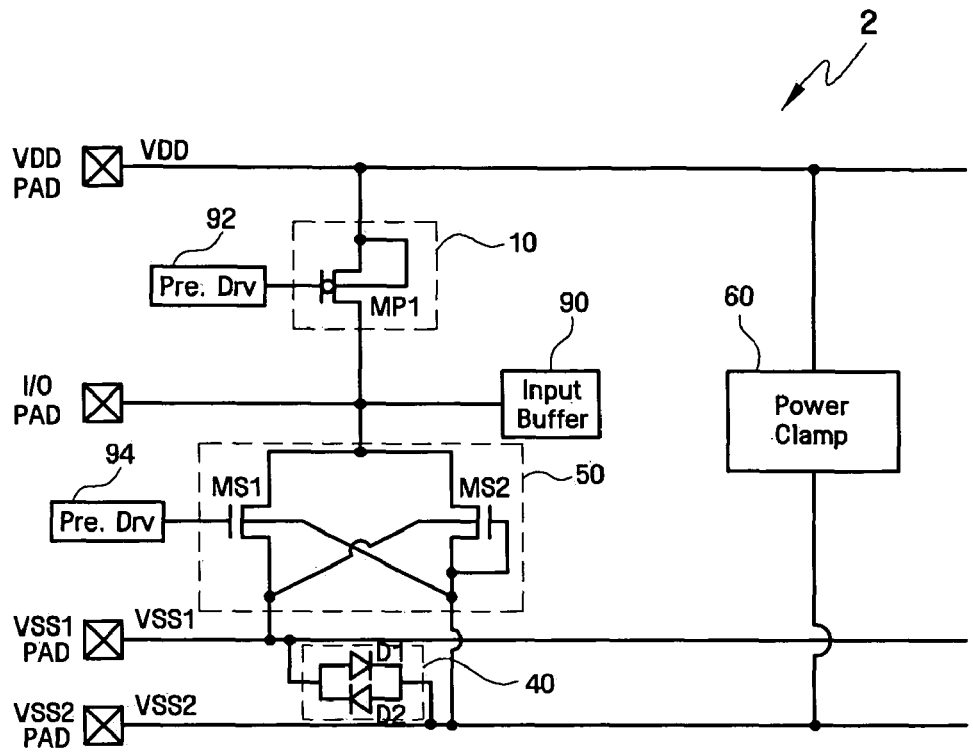
FIG. 7 illustrates an electrostatic discharge circuit in accordance with another example embodiment of the present invention.

FIG. 7 illustrates an electrostatic discharge circuit in accordance with another example embodiment of the present invention. As illustrated in FIG. 7, the electrostatic discharge circuit 2 may include a pull-up device 10, a pull-down device 50 and a power clamp 60. As illustrated in FIG. 7, the pull-down device 50 may include a first NMOSFET transistor MS1 and a second NMOSFET transistor MS2. In an example embodiment, as illustrated in FIG. 7, ESD protection may be provided by the pull-down device 50 of the electrostatic discharge circuit 2. As illustrated in FIG. 7, the pull-down device 50 may be located between the I/O pad and the ground voltage supply lines. As a result, the ESD current from the I/O pad may be discharged, without utilizing the VDD line, as in the example embodiment illustrated in FIG. 1. In example embodiments, the pre-driver 92 and the pre-driver 94 are the same circuit and provide the same signal.

As shown in FIG. 7, in more detail, the first NMOSFET transistor MS1 may be connected from the I/O pad to a first ground voltage supply line VSS1, which has a gate coupled to a pre-driver circuit 94 and a body connected to a second ground voltage supply line VSS2. Similarly, the second NMOSFET transistor MS2 may be connected from the I/O pad to the second ground voltage supply line VSS2, which has a gate coupled to the second ground voltage supply line VSS2, and a body connected to the first voltage supply line VSS1.

In example embodiments, the first NMOSFET transistor MS1 and/or the second NMOSFET transistor MS2, may be MOS transistors, NPN, PNP bipolar transistors, field transistors, thyristors, etc.

In example embodiments, the power clamp 60 may be implemented with MOS transistors, thyristors, and/or as the power clamp 30 of FIG. 1.

Figure 8:
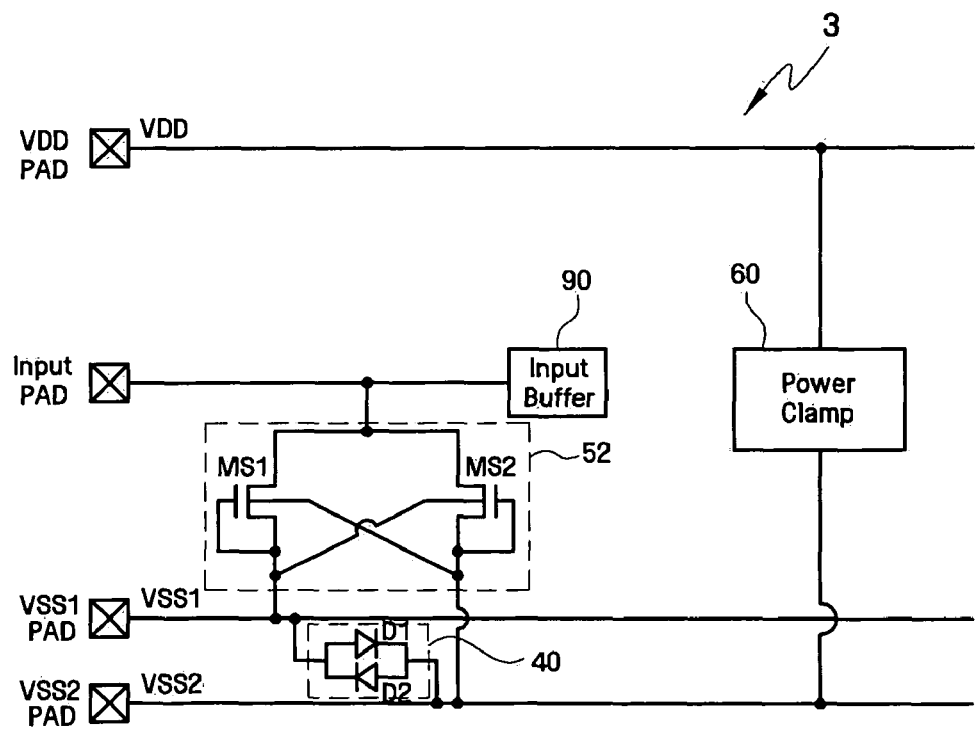
FIG. 8 illustrates an electrostatic discharge in accordance with another example embodiment of the present invention.

FIG. 8 illustrates an electrostatic discharge circuit in accordance with another example embodiment of the present invention. As illustrated in FIG. 8, the electrostatic discharge circuit 3 may include a pull-down circuit 52. As illustrated in FIG. 8, the transistors of the ESD protection circuit are coupled to an I/O pad and are connected to separate ground voltage supply lines, VSS1 and VSS2. The example embodiment illustrated in FIG. 8 is substantially similar to the example embodiment illustrated in FIG. 7, with the exception of the omission of the pull-up device 10.

Figure 9A:
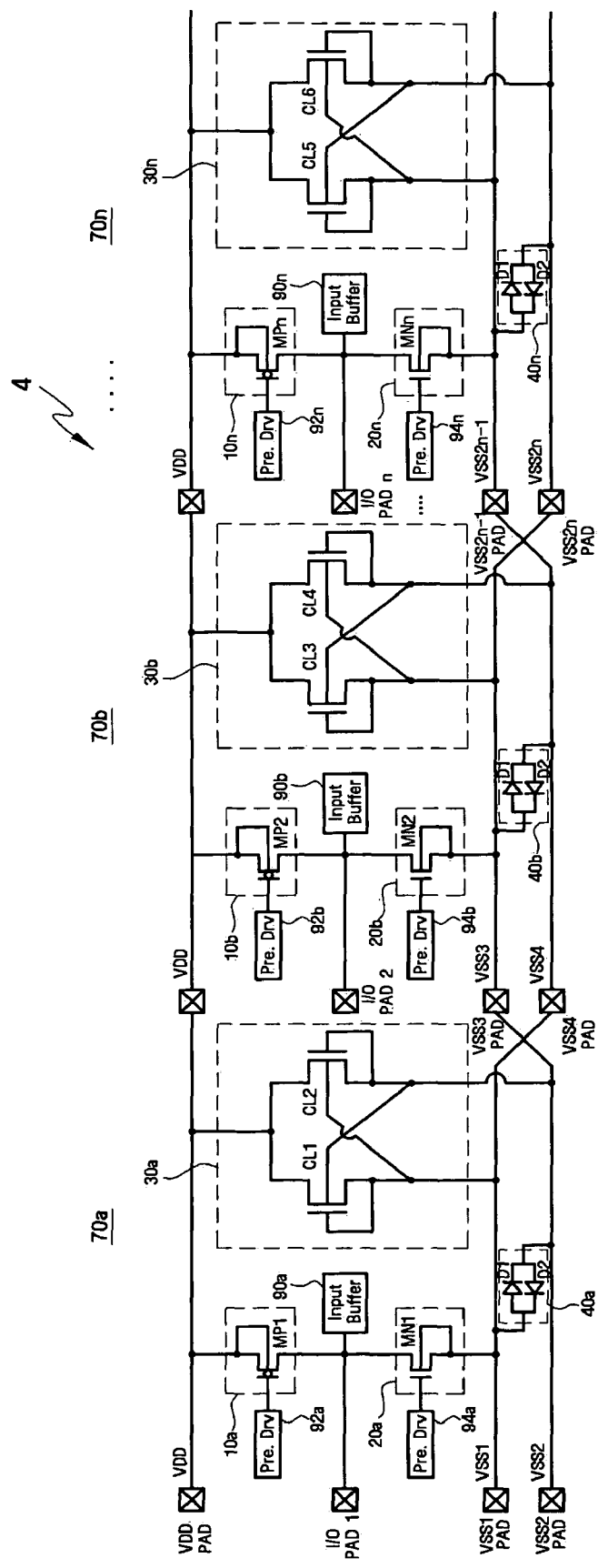
FIG. 9a illustrates an electrostatic discharge in accordance with another example embodiment of the present invention.

FIG. 9a illustrates an electrostatic discharge in accordance with another example embodiment of the present invention. As illustrated in FIG. 9a, the electrostatic discharge circuit 4 may include n (where n is an integer>1) integrated circuit blocks 70a, 70b, ..., 70n, where each integrated circuit block 70n has the structure of the electrostatic discharge circuit 1 of FIG. 1.

As illustrated in FIG. 9a, the first IC block 70a may further include a first I/O pad I/OPAD 1, a pull-up device 10a, a pull-down device 20a, a power clamp 30a, a power voltage supply line VDD, a first ground voltage supply line VSS1 and a second ground voltage supply line VSS2 which are electrically isolated from each other by transfer device 40a.

The electrostatic discharge circuit 4 may further include a second IC block 70b, further including a second I/O pad I/O PAD 2, a pull-up device 10b, a pull-down device 20b, a power clamp 30b, a power voltage supply line VDD, a third ground voltage supply line VSS3 and a second ground voltage supply line VSS4, which are electrically isolated from each other by a transfer device 40b.

In an example embodiment of the present invention, as shown in FIG. 9a, VSS1 of the first IC block 70a may be connected to VSS4 of the second IC block 70b and VSS2 of the first IC block 70a may be connected to VSS3 of the second IC block 70b. More generally, as shown in FIG. 9a, VSS(2n−3) and VSS(2n−2) of the (n−1)$^{th}$ IC block may be connected to VSS(2n) and VSS(2n−1) of the n$^{th}$ IC block, respectively.

Figure 9B:
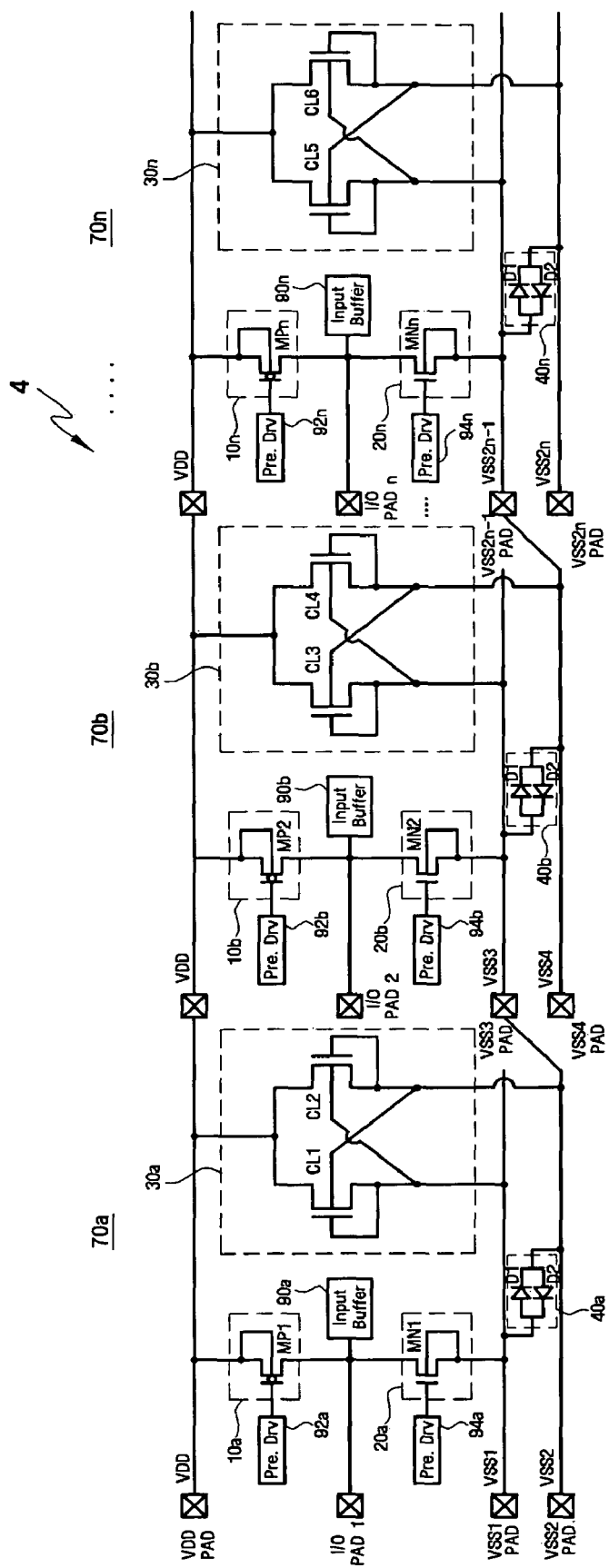
FIG. 9b illustrates an electrostatic discharge circuit in accordance with another example embodiment of the present invention.

FIG. 9b illustrates an electrostatic discharge circuit in accordance with another example embodiment of the present invention. The electrostatic discharge of FIG. 9b is similar to the electrostatic discharge circuit of FIG. 9a, except VSS1 may be electrically isolated from VSS4. As more generally illustrated in FIG. 9b, each ground voltage supply line may be connected to a ground voltage supply line of another IC block and/or isolated from the other ground voltage supply line of its own block.

Figure 10A:
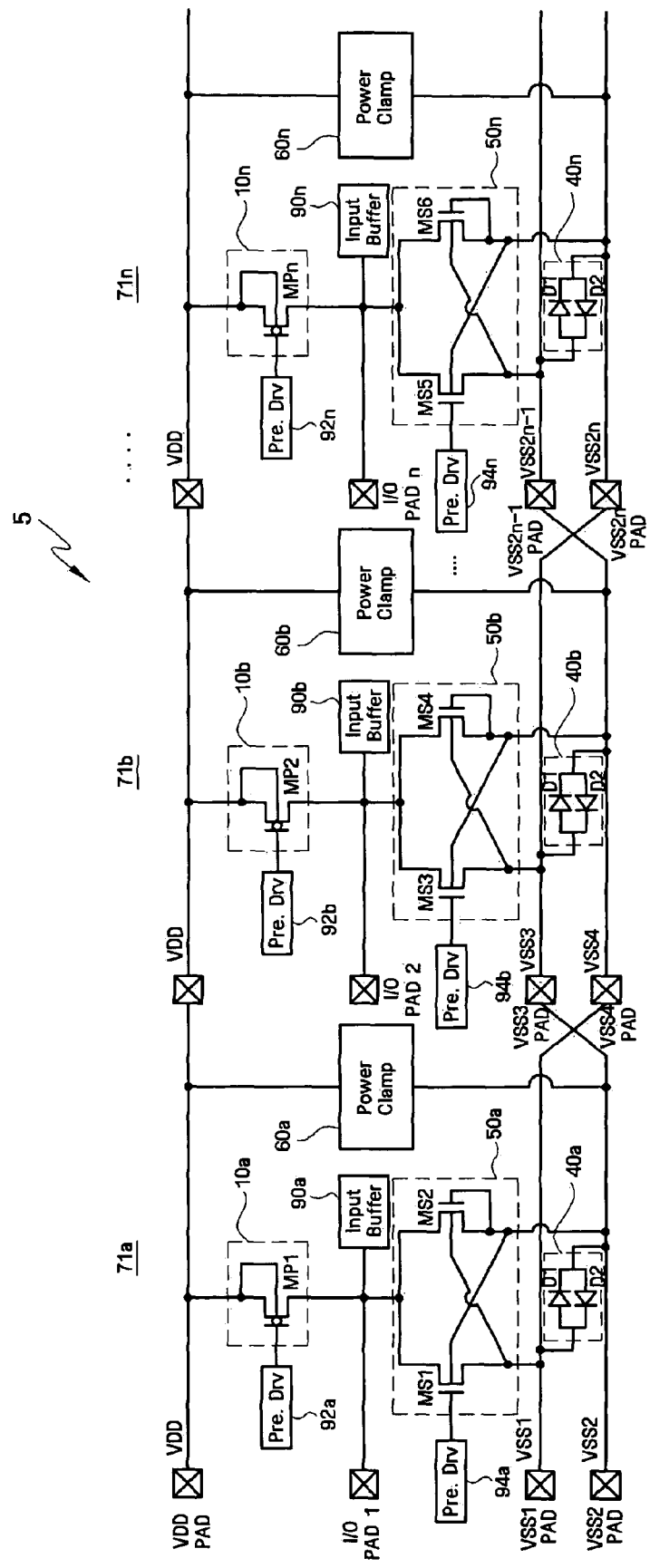
FIG. 10a illustrates an electrostatic discharge in accordance with another example embodiment of the present invention.

FIG. 10a illustrates an electrostatic discharge in accordance with another example embodiment of the present invention. As illustrated in FIG. 10a, the electrostatic discharge circuit 5 may include n (where n is an integer>1) integrated circuit blocks 71a, 71b, ..., 71n, where each integrated circuit block 71n has the structure of the electrostatic discharge circuit 2 of FIG. 7.

As illustrated in FIG. 10a, the electrostatic discharge circuit 5 may further include a first IC block 71a, further including a first I/O pad I/OPAD 1, a pull-up device 10a, a pull-down device 50a, a power clamp 60a, a power voltage supply line VDD, a first ground voltage supply line VSS1 and a second ground voltage supply line VSS2 which are electrically isolated from each other by transfer device 40a.

The electrostatic discharge circuit 5 may further include a second IC block 71b, further including a second I/O pad I/O PAD 2, a pull-up device 10b, a pull-down device 50b, a power clamp 60b, a power voltage supply line VDD, a third ground voltage supply line VSS3 and a second ground voltage supply line VSS4, which are electrically isolated from each other by a transfer device 40b.

In an example embodiment of the present invention, as shown in FIG. 10a, VSS1 of the first IC block 71a may be connected to VSS4 of the second IC block 71b and VSS2 of the first IC block 71a may be connected to VSS3 of the second IC block 71b. More generally, as shown in FIG. 10a, VSS(2n−3) and VSS(2n−2) of the (n−1)$^{th}$ IC block may be connected to VSS(2n) and VSS(2n−1) of the n$^{th}$ IC block, respectively.

Figure 10B:
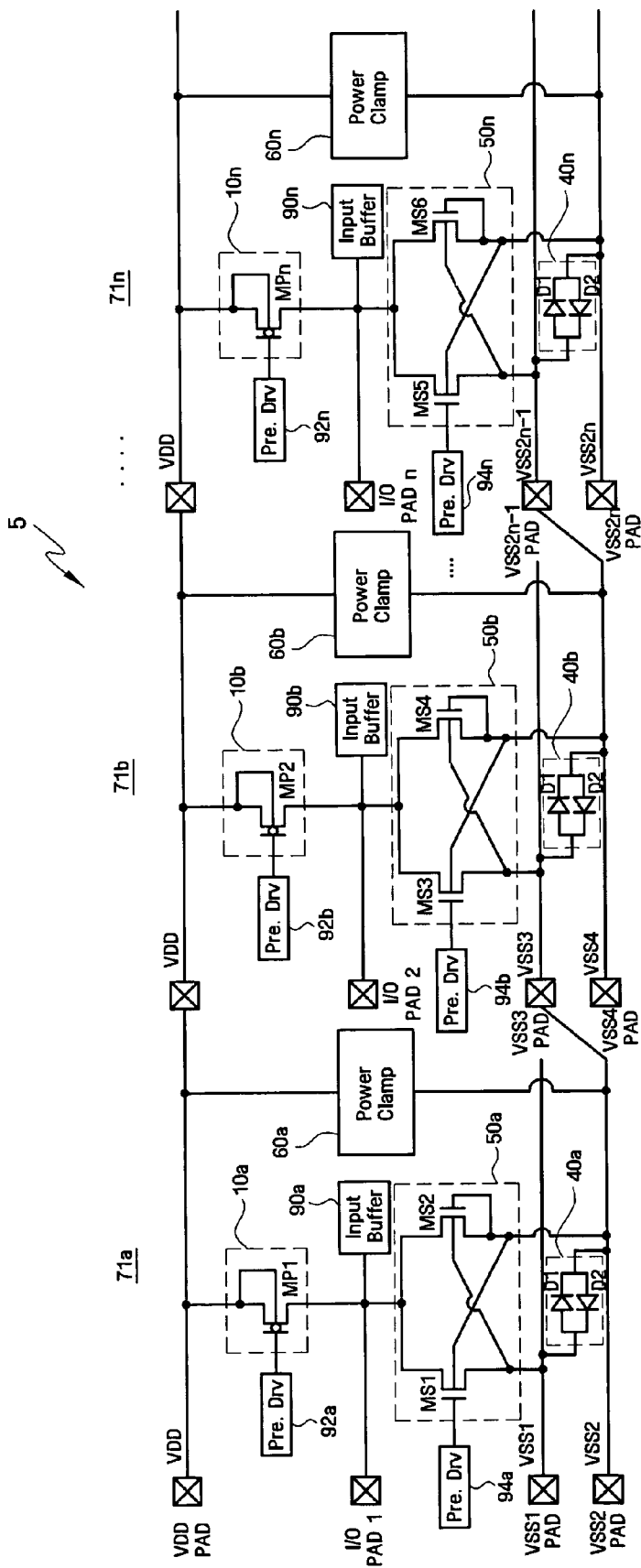
FIG. 10b illustrates an electrostatic discharge in accordance with another example embodiment of the present invention.

FIG. 10b illustrates an electrostatic discharge circuit in accordance with another example embodiment of the present invention. The electrostatic discharge of FIG. 10b is similar to the electrostatic discharge circuit of FIG. 10a, except VSS1 may be electrically isolated from VSS4. As more generally illustrated in FIG. 10b, each ground voltage supply line may be connected to a ground voltage supply line of another IC block and/or isolated from the other ground voltage supply line of its own block.

Figure 11A:
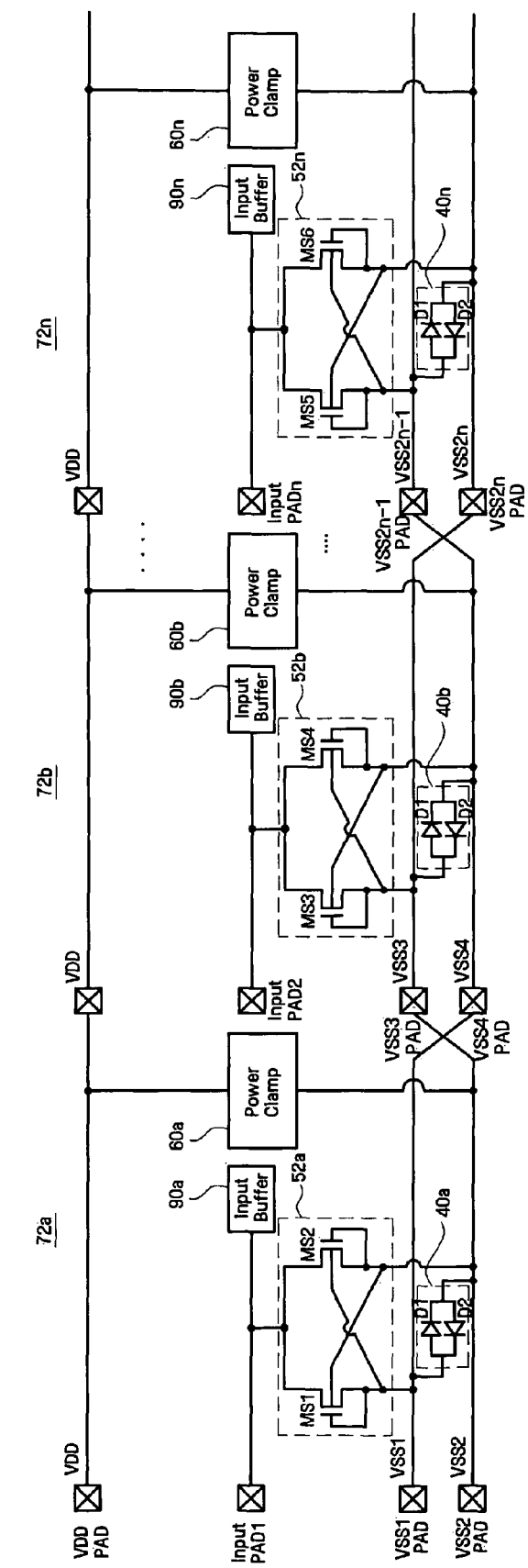
FIG. 11a illustrates an electrostatic discharge in accordance with another example embodiment of the present invention.

FIG. 11a illustrates an electrostatic discharge in accordance with another example embodiment of the present invention. As illustrated in FIG. 11a, the electrostatic discharge circuit 6 may include n (where n is an integer>1) integrated circuit blocks 72a, 72b, . . . , 72n, where each integrated circuit block 72n has the structure of the electrostatic discharge circuit 3 of FIG. 8.

As illustrated in FIG. 11a, the electrostatic discharge circuit 6 may further include a first IC block 72a, further including a first I/O pad I/OPAD 1, a pull-down device 52a, a power clamp 60a, a power voltage supply line VDD, a first ground voltage supply line VSS1 and a second ground voltage supply line VSS2 which are electrically isolated from each other by transfer device 40a.

The electrostatic discharge circuit 5 may further include a second IC block 71b, further including a second I/O pad I/O PAD 2, a pull-down device 52b, a power clamp 60b, a power voltage supply line VDD, a third ground voltage supply line VSS3 and a second ground voltage supply line VSS4, which are electrically isolated from each other by a transfer device 40b.

In an example embodiment of the present invention, as shown in FIG. 11a, VSS1 of the first IC block 72a may be connected to VSS4 of the second IC block 72b and VSS2 of the first IC block 72a may be connected to VSS3 of the second IC block 72b. More generally, as shown in FIG. 11a, VSS (2n−3) and VSS(2n−2) of the (n−1)$^{th}$ IC block may be connected to VSS(2n) and VSS(2n−1) of the n$^{th}$ IC block, respectively.

Figure 11B:
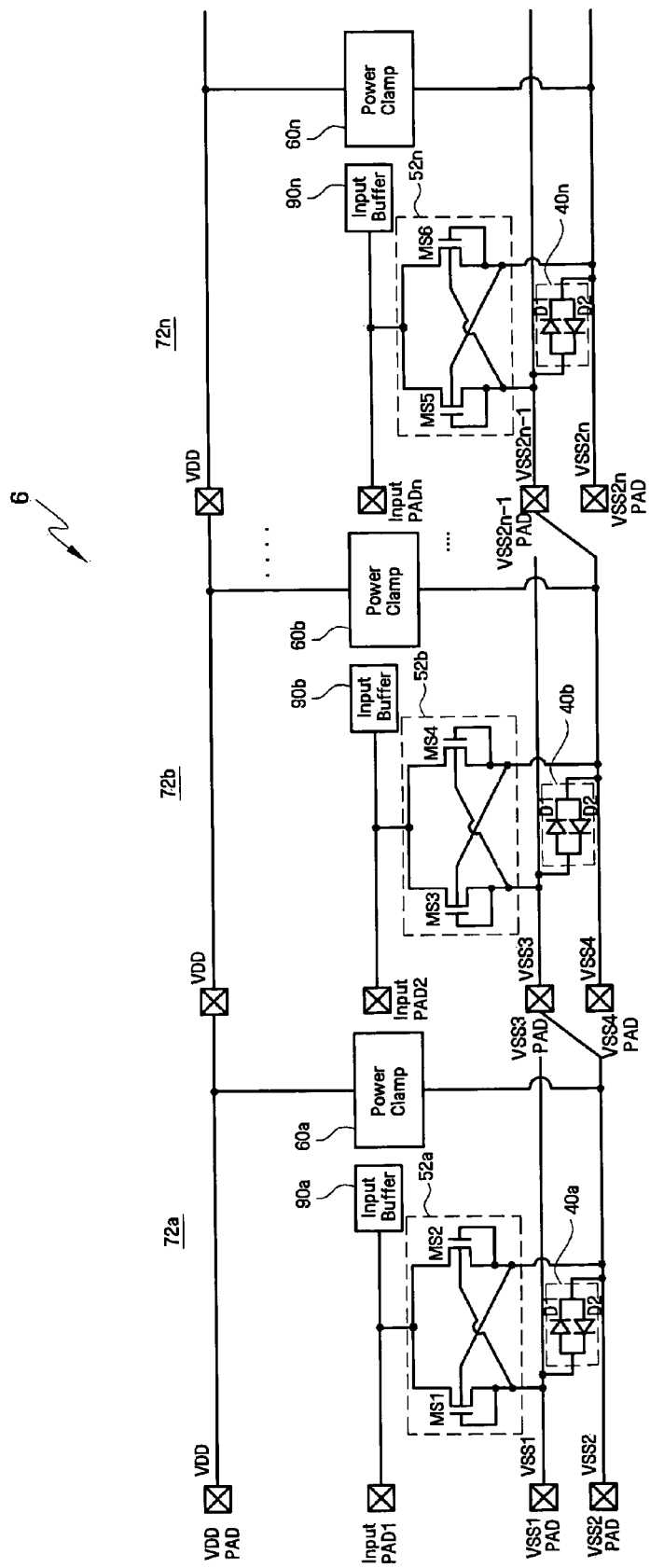
FIG. 11b illustrates an electrostatic discharge in accordance with another example embodiment of the present invention.

FIG. 11b illustrates an electrostatic discharge circuit in accordance with another example embodiment of the present invention. The electrostatic discharge of FIG. 11b is similar to the electrostatic discharge circuit of FIG. 11a, except VSS1 may be electrically isolated from VSS4. As more generally illustrated in FIG. 11b, each ground voltage supply line may be connected to a ground voltage supply line of another IC block and/or isolated from the other ground voltage supply line of its own block.

Figure 12:
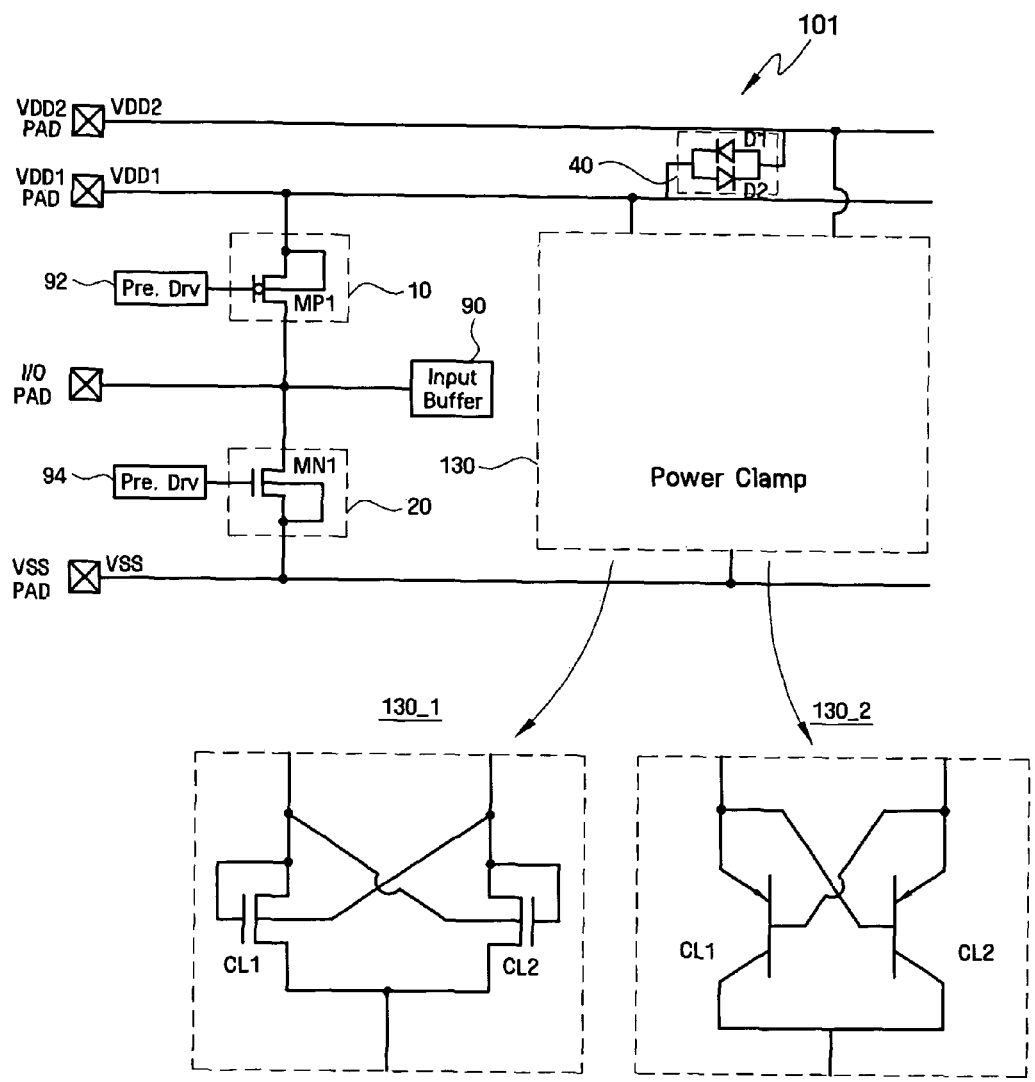
FIG. 12 illustrates an electrostatic discharge circuit in accordance with an example embodiment of the present invention.

FIG. 12 illustrates an electrostatic discharge circuit in accordance with an example embodiment of the present invention. As shown in FIG. 12, the example electrostatic discharge circuit 101 may include a pull-up device 10, a pull-down device 20, a power clamp 130, and/or a transfer circuit 40. The electrostatic discharge device 101 may be connected to at least one positive supply voltage, for example, at least one VDD pad, for example, VDD1 pad and VDD2 pad, which may supply positive supply voltages, for example, VDD1 and VDD2 signals, and a ground or reference supply voltage, for example, a VSS pad, for example, which may supply a VSS signal.

In another example embodiment, the electrostatic discharge device 101 may further include a pre-driver 92 connected to the pull-up device 10 and/or a pre-driver 94 connected to the pull-down device 20, and/or an input buffer 90. As shown in FIG. 12, the I/O pad may be connected to internal logic or other internal circuitry of the electrostatic discharge circuit 101 through the input buffer 90. In example embodiments, the pre-driver 92 and the pre-driver 94 are the same circuit and provide the same signal.

In another example embodiment, the pull-up device 10 may include a p-channel MOSFET MP1, connected from a power supply line, for example, either VDD1 or VDD2, to the I/O pad. The p-channel MOSFET MP1 may have its gate coupled to the pre-driver circuit 92.

In another example embodiment, the pull-down device 20 may include an n-channel MOSFET MN1, connected from the I/O pad to a ground voltage supply line, for example, VSS. The n-channel MOSFET MN1 may have its gate coupled to the pre-driver circuit 94.

In an example embodiment, the power clamp 130 may be positioned between one or more of the VDD lines and the VSS line. In an example embodiment, the power clamp 130 may include one or more clamp devices, for example, a first clamp device CL1 and a second clamp device CL2.

In an example embodiment, the first clamp device CL1 may be connected between VDD1 and VSS and the second clamp device CL2 may be connected between VDD2 and VSS.

As further shown in FIG. 12, the power clamp 130 may be implemented in several different ways, for example, as shown by power clamp 130-1 or power clamp 130-2. As illustrated, for example, power clamp 130-1 or power clamp 130-2 may include various arrangements of NMOSFET transistors, PMOSFET transistors and/or or NPN, PNP bipolar transistors.

As illustrated, power clamp 130-1 may include a first NMOSFET transistor CL1 and a second NMOSFET transistor CL2. In an example embodiment, NMOSFET transistor CL1 may be connected from a first VDD line VDD1 to the ground voltage supply line VSS, which has a gate connected to VDD1 and a body connected to VDD2. In an example embodiment of the present invention, the second NMOSFET CL2 may be connected from the second VDD line VDD2 to the ground voltage supply line VSS, which has a gate connected to VDD2 and a body connected to VDD1.

In another example embodiment, the power clamp 130 may be implemented as power clamp 130-2, including a first NPN bipolar transistor CL1 and a second NPN bipolar transistor CL2. In an example embodiment, the emitter of the first NPN bipolar transistor CL1 may be connected to a first voltage supply line VDD1 and further connected to the base of CL2. The collector of the first NPN bipolar transistor CL1 may be connected to VSS. In an example embodiment, the emitter of the second NPN bipolar transistor CL2 may be connected to a second voltage supply line VDD2 and further connected to the base of the first NPN bipolar transistor CL1. The collector of the second NPN bipolar transistor CL2 may be connected to VSS.

In an example embodiment, the transfer circuit 40 may electrically isolate the first voltage supply line VDD1 from the second voltage supply line VDD2 during normal operation and transfer an abnormal charge from one voltage supply line to the other voltage supply line during an ESD event.

Figure 13:
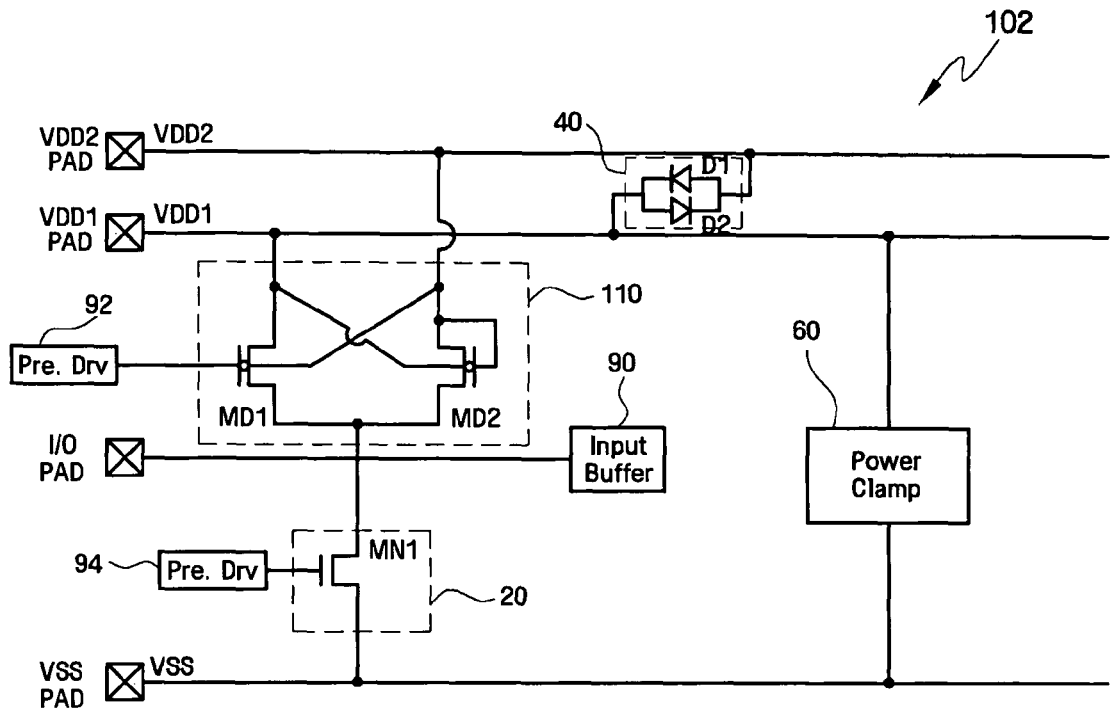
FIG. 13 illustrates an electrostatic discharge circuit in accordance with another example embodiment of the present invention.

FIG. 13 illustrates an electrostatic discharge circuit in accordance with another example embodiment of the present invention. As illustrated in FIG. 13, the electrostatic discharge circuit 102 may include a pull-up device 110, a pull-down device 20 and a power clamp 60. As illustrated in FIG. 13, the pull-up device 110 may include a first NMOSFET transistor MD1 and a second NMOSFET transistor MD2. In an example embodiment, as illustrated in FIG. 13, ESD protection may be provided by the pull-up device 110 of the electrostatic discharge circuit 102. As illustrated in FIG. 13, the pull-up device 110 may be located between power supply lines VDD1, VDD2 and an I/O pad. As a result, the ESD current from the I/O pad may be discharged, without utilizing the VSS line, as in the example embodiment illustrated in FIG. 12. In example embodiments, the pre-driver 92 and the pre-driver 94 are the same circuit and provide the same signal.

As shown in FIG. 13, in more detail, the first NMOSFET transistor MD1 may be connected from a first power supply line VDD1 to the I/O pad, which has a gate coupled to a pre-driver circuit 92 and a body connected to a second power voltage supply line VSS2. Similarly, the second NMOSFET transistor MD2 may be connected from the second power voltage supply line VDD2 to the I/O pad, and have a gate coupled to the second power voltage supply line VDD2, and a body connected to the first voltage supply line VDD1.

In example embodiments, the first NMOSFET transistor MD1 and/or the second NMOSFET transistor MD2, may be MOS transistors, NPN, PNP bipolar transistors, field transistors, thyristors, etc.

In example embodiments, the power clamp 60 may be implemented with MOS transistors, thyristors, and/or as the power clamp 30 of FIG. 1.

Figure 14:
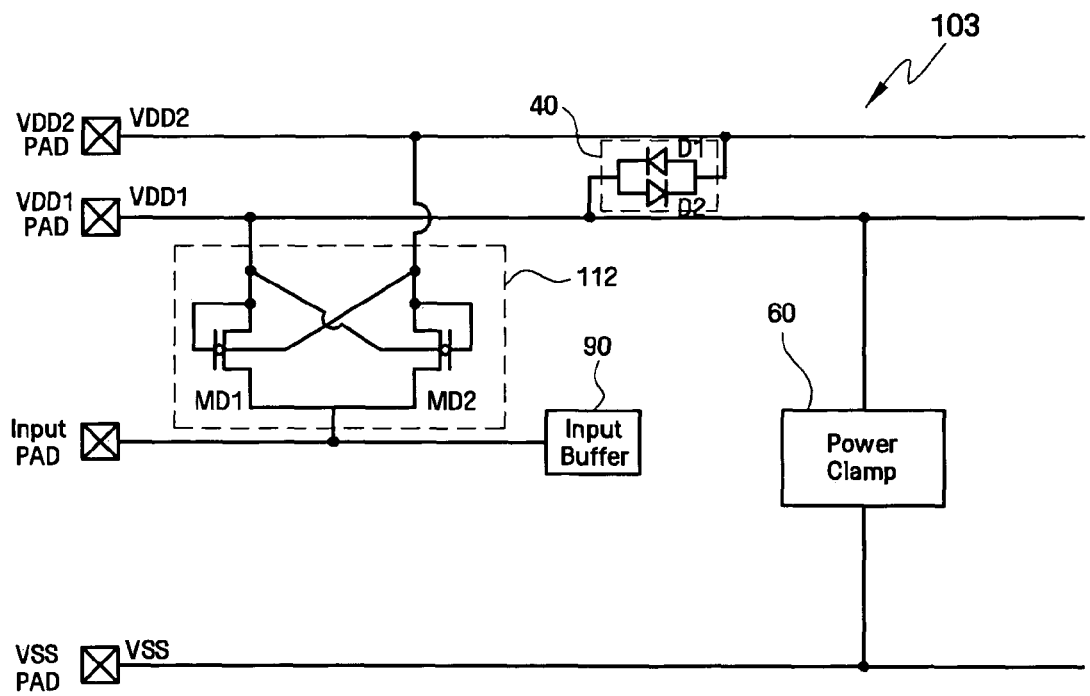
FIG. 14 illustrates an electrostatic discharge circuit in accordance with another example embodiment of the present invention.

FIG. 14 illustrates an electrostatic discharge circuit in accordance with another example embodiment of the present invention. As illustrated in FIG. 14, the electrostatic discharge circuit 103 may include a pull-up circuit 112. As illustrated in FIG. 14, the transistors of the ESD protection circuit are coupled to an I/O pad and are connected to separate power voltage supply lines, VDD1 and VDD2. The example embodiment illustrated in FIG. 14 is substantially similar to the example embodiment illustrated in FIG. 13, with the exception of the omission of the pull-down device 20.

Figure 15A:
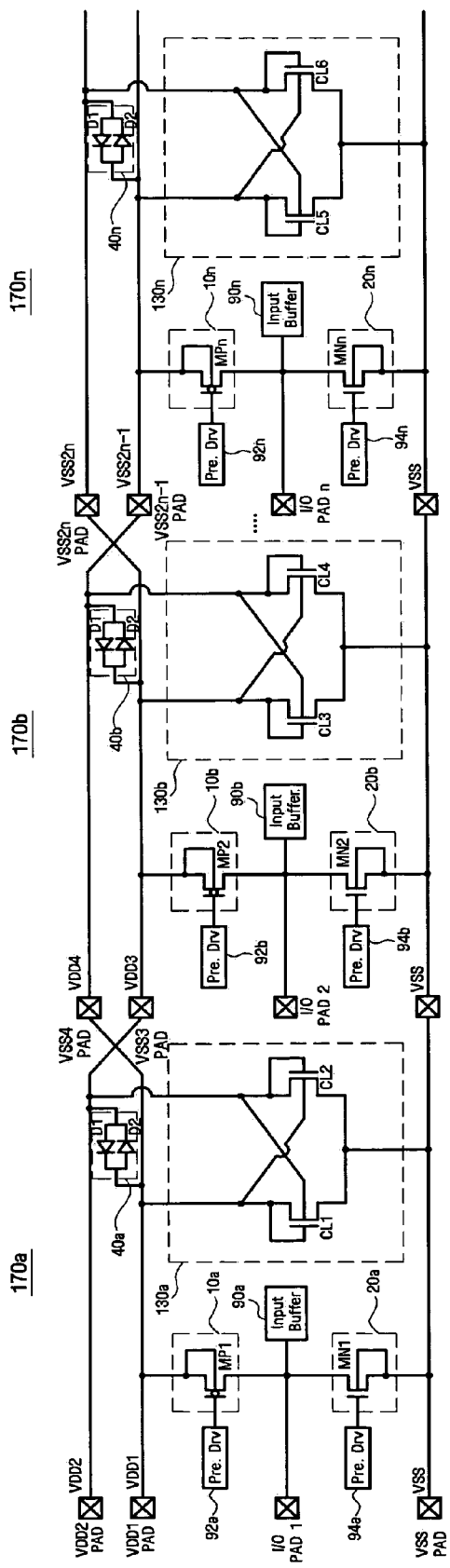
FIG. 15a illustrates an electrostatic discharge in accordance with another example embodiment of the present invention.

FIG. 15a illustrates an electrostatic discharge in accordance with another example embodiment of the present invention. As illustrated in FIG. 15a, the electrostatic discharge circuit 104 may include n (where n is an integer>1) integrated circuit blocks 170a, 170b, . . . , 170n, where each integrated circuit block 170n has the structure of the electrostatic discharge circuit 101 of FIG. 12.

As illustrated in FIG. 15a, the electrostatic discharge circuit 104 may further include a first IC block 170a, further including a first I/O pad I/O PAD 1, a pull-up device 10a, a pull-down device 20a, a power clamp 130a, a first power voltage supply line VDD1 and a second power voltage supply line VSS2, which are electrically isolated from each other by transfer device 40a, and a ground voltage supply line VSS.

The electrostatic discharge circuit 104 may further include a second IC block 170b, further including a second I/O pad I/O PAD 2, a pull-up device 10b, a pull-down device 20b, a power clamp 130b, a third power voltage supply line VDD3 and a fourth power voltage supply line VDD4, which are electrically isolated from each other by a transfer device 40b.

In an example embodiment of the present invention, as shown in FIG. 15a, VDD1 of the first IC block 170a may be connected to VDD4 of the second IC block 170b and VDD2 of the first IC block 170a may be connected to VDD3 of the second IC block 170b. Similarly, as shown in FIG. 15a, VDD($2n-3$) and VDD($2n-2$) of the $(n-1)^{th}$ IC block may be connected to VDD($2n$) and VDD($2n-1$) of the $n^{th}$ IC block, respectively.

Figure 15B:
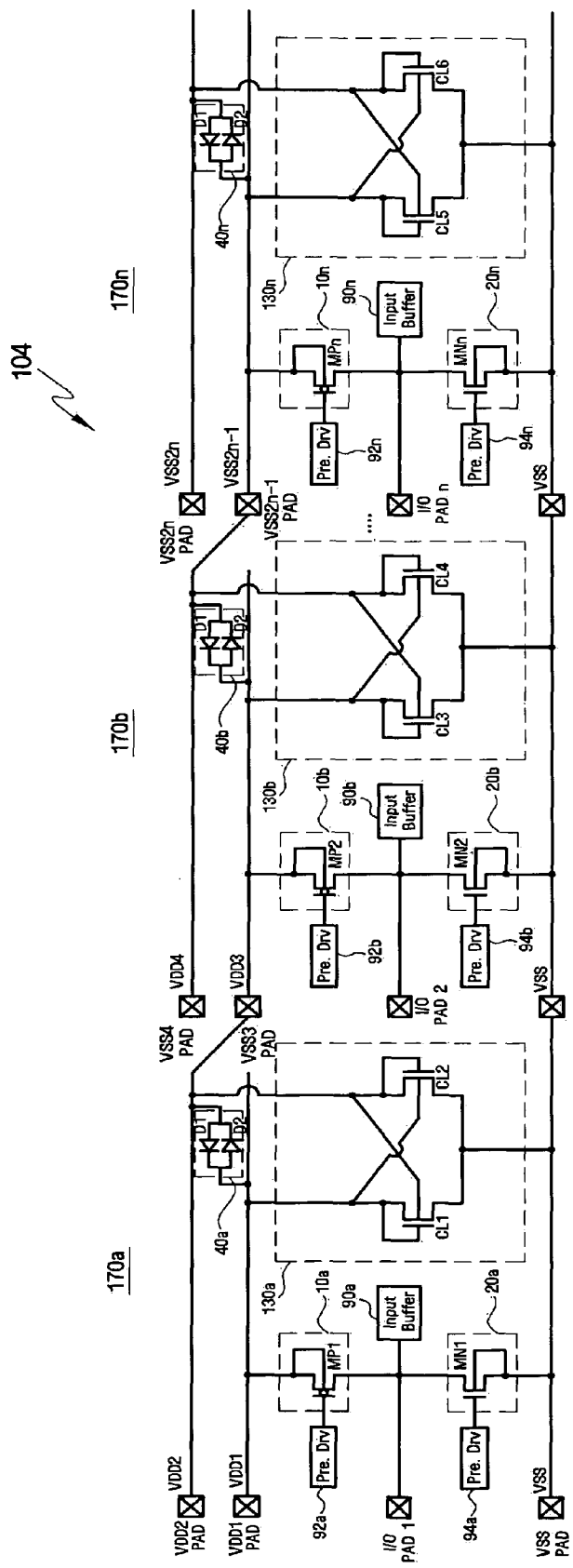
FIG. 15b illustrates an electrostatic discharge circuit in accordance with another example embodiment of the present invention.

FIG. 15b illustrates an electrostatic discharge circuit in accordance with another example embodiment of the present invention. The electrostatic discharge of FIG. 15b is similar to the electrostatic discharge circuit of FIG. 15a, except VDD1 may be electrically isolated from VDD4. As more generally illustrated in FIG. 15b, each ground voltage supply line may be connected to a ground voltage supply line of another IC block and/or isolated from the other ground voltage supply line of its own block.

Figure 16A:
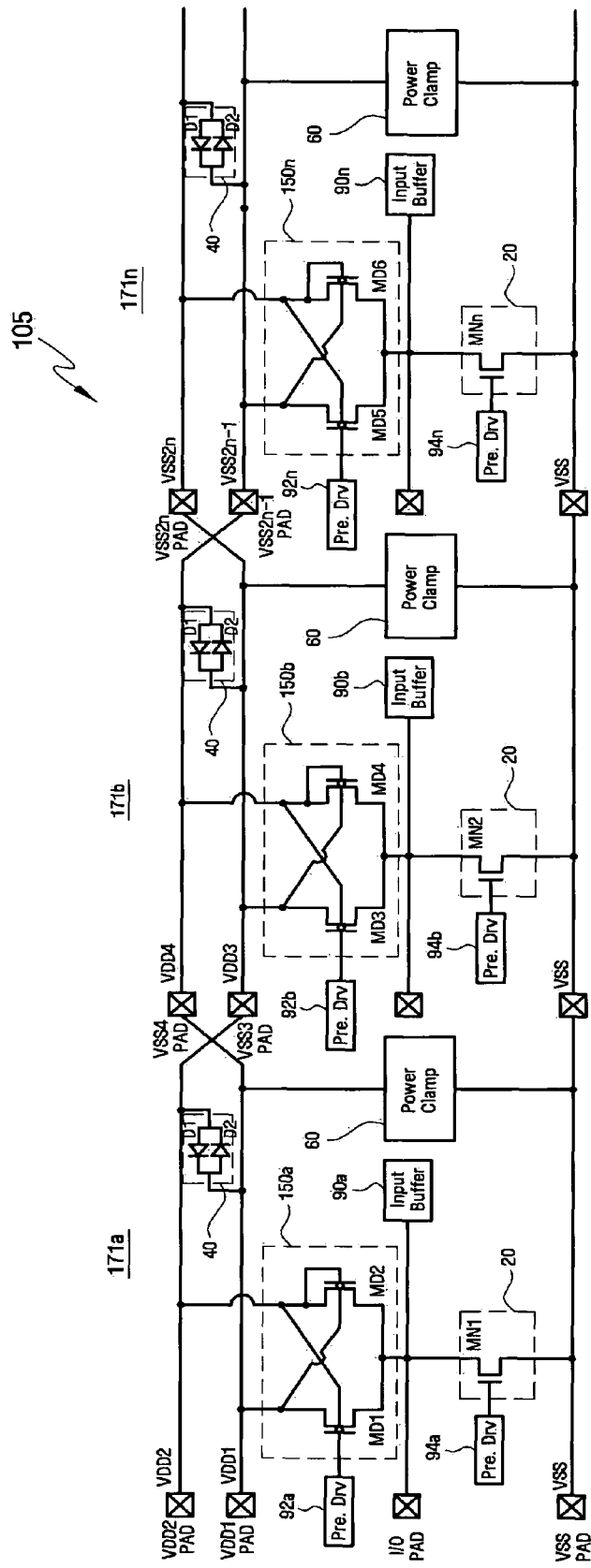
FIG. 16a illustrates an electrostatic discharge in accordance with another example embodiment of the present invention.

FIG. 16a illustrates an electrostatic discharge circuit in accordance with another example embodiment of the present invention. As illustrated in FIG. 16a, the electrostatic discharge circuit 105 may include n (where n is an integer>1) integrated circuit blocks 171a, 171b, . . . , 171n, where each integrated circuit block 171n has the structure of the electrostatic discharge circuit 102 of FIG. 13.

As illustrated in FIG. 16a, the electrostatic discharge circuit 105 may further include a first IC block 171a, further including a first I/O pad I/OPAD 1, a pull-up device 150a, a pull-down device 20a, a power clamp 60a, a first power voltage supply line VDD1 and a second power voltage supply line VDD2 which are electrically isolated from each other by transfer device 40a and a ground voltage supply line VSS.

The electrostatic discharge circuit 105 may further include a second IC block 171b, further including a second I/O pad I/O PAD 2, a pull-up device 150b, a pull-down device 20b, a power clamp 60b, a third power voltage supply line VDD3 and a fourth power voltage supply line VDD4, which are electrically isolated from each other by a transfer device 40b and a ground voltage supply line VSS.

In an example embodiment of the present invention, as shown in FIG. 16a, VDD1 of the first IC block 171a may be connected to VDD4 of the second IC block 171b and VDD2 of the first IC block 171a may be connected to VDD3 of the second IC block 171b. Similarly, as shown in FIG. 16a, VDD($2n-3$) and VDD($2n-2$) of the $(n-1)^{th}$ IC block may be connected to VDD($2n$) and VDD($2n-1$) of the $n^{th}$ IC block, respectively.

Figure 16B:
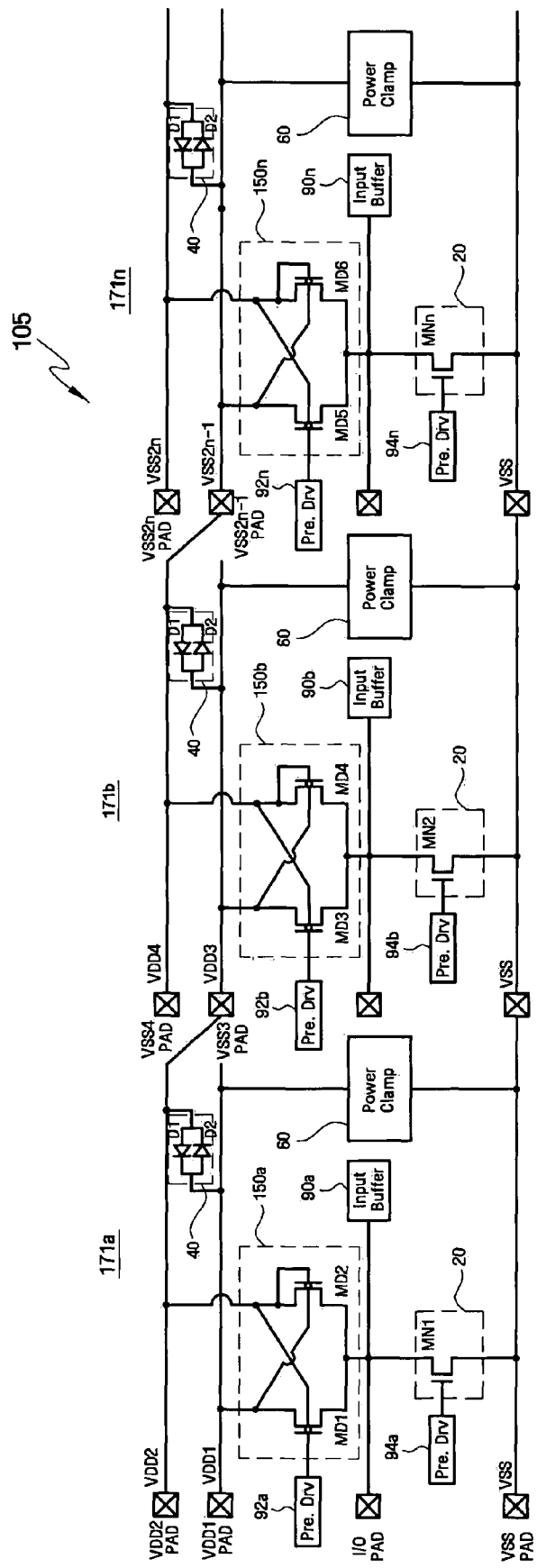
FIG. 16b illustrates an electrostatic discharge in accordance with another example embodiment of the present invention.

FIG. 16b illustrates an electrostatic discharge circuit in accordance with another example embodiment of the present invention. The electrostatic discharge of FIG. 16b is similar to the electrostatic discharge circuit of FIG. 16a, except VDD1 may be electrically isolated from VDD4. As more generally illustrated in FIG. 16b, each ground voltage supply line may be connected to a ground voltage supply line of another IC block and/or isolated from the other ground voltage supply line of its own block.

Figure 17A:
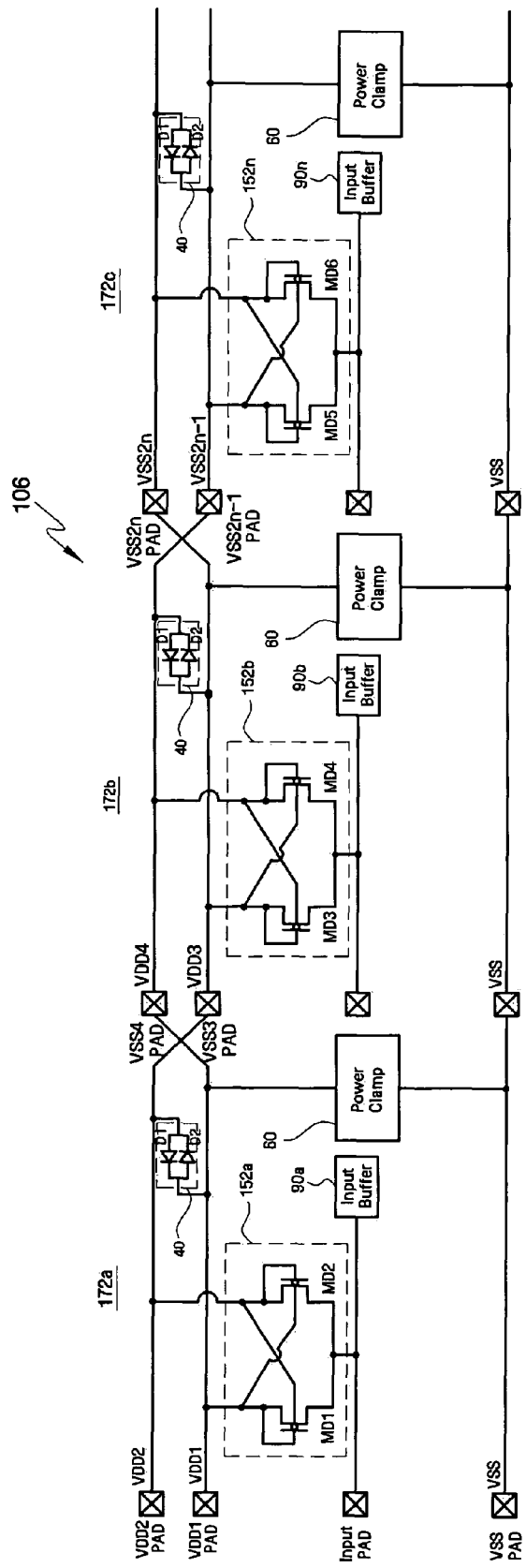
FIG. 17a illustrates an electrostatic discharge in accordance with another example embodiment of the present invention.

FIG. 17a illustrates an electrostatic discharge in accordance with another example embodiment of the present invention. As illustrated in FIG. 17a, the electrostatic discharge circuit 106 may include n (where n is an integer>1) integrated circuit blocks 172a, 172b, . . . , 172n, where each integrated circuit block 172n has the structure of the electrostatic discharge circuit 103 of FIG. 14.

As illustrated in FIG. 17a, the electrostatic discharge circuit 106 may further include a first IC block 172a, further including a first I/O pad I/O PAD 1, a pull-up device 152a, a power clamp 60a, a first power voltage supply line VDD1 and a second power voltage supply line VDD2 which are electrically isolated from each other by transfer device 40a, and a ground voltage supply line VSS.

The electrostatic discharge circuit 106 may further include a second IC block 172b, further including a second I/O pad I/O PAD 2, a pull-up device 152b, a power clamp 60b, a third power voltage supply line VDD3 and a fourth power voltage supply line VDD4, which are electrically isolated from each other by a transfer device 40b, and a ground voltage supply line VSS.

In an example embodiment of the present invention, as shown in FIG. 17a, VDD1 of the first IC block 172a may be connected to VDD4 of the second IC block 172b and VDD2 of the first IC block 172a may be connected to VDD3 of the second IC block 172b. More generally, as shown in FIG. 17a, VDD($2n-3$) and VDD($2n-2$) of the $(n-1)^{th}$ IC block may be connected to VDD($2n$) and VDD($2n-1$) of the $n^{th}$ IC block, respectively.

Figure 17B:
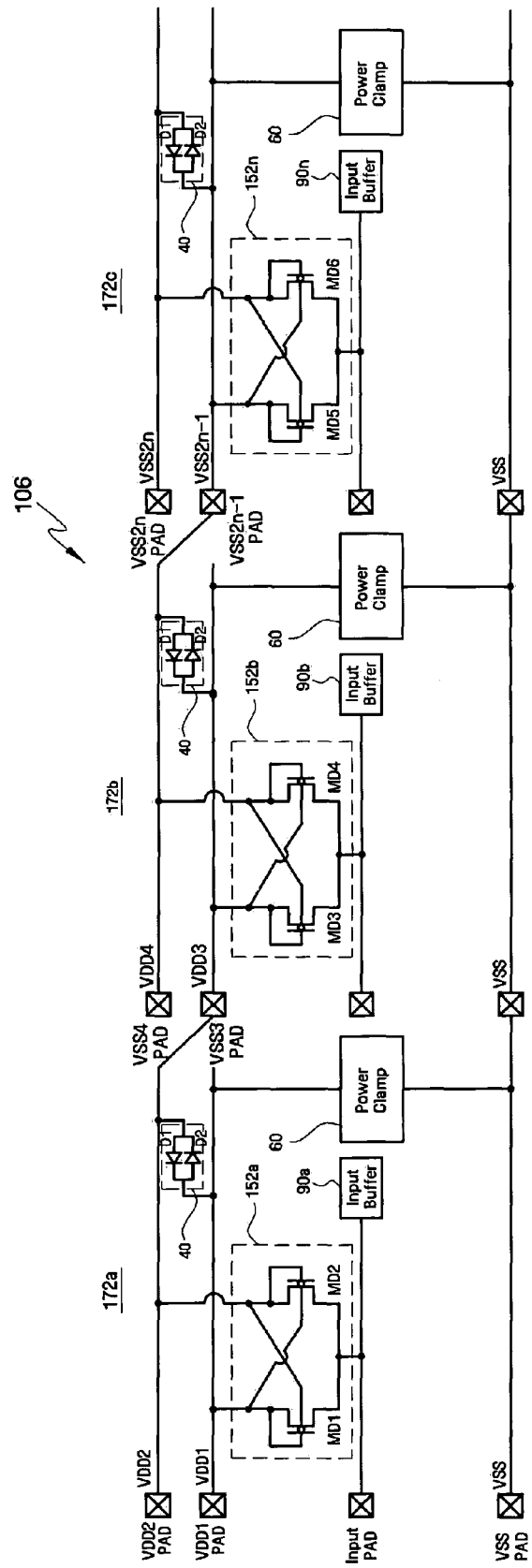
FIG. 17b illustrates an electrostatic discharge in accordance with another example embodiment of the present invention.

FIG. 17b illustrates an electrostatic discharge circuit in accordance with another example embodiment of the present invention. The electrostatic discharge of FIG. 17b is similar to the electrostatic discharge circuit of FIG. 17a, except VDD1 may be electrically isolated from VDD4. As more generally illustrated in FIG. 17b, each ground voltage supply line may be connected to a ground voltage supply line of another IC block and/or isolated from the other ground voltage supply line of its own block.

As set forth above, in example embodiments of the present invention, an electrostatic discharge circuit is provided including at least one electrostatic discharge circuit element, where the at least one electrostatic discharge circuit element has a source or a body in a floating state. In example embodiments of the present invention, the source or a body in a floating state provides a path to discharge an electrostatic current.

In example embodiments of the present invention, the at least one electrostatic discharge circuit element is a pull-up circuit, a plurality of pull-up circuits, a pull-down circuit, a plurality of pull-down circuits, a power clamp, a plurality of power clamps, or other similar circuit or circuits.

In example embodiments of the present invention, the at least one electrostatic discharge circuit element is connected between at least one power terminal (for example, VDD1, VDD2) and at least one ground terminal (for example, VSS1, VSS2).

In example embodiments of the present invention, the at least one electrostatic discharge circuit element is connected between at least one I/O terminal (for example, I/O 1) and at least one ground terminal (for example, VSS1, VSS2). In example embodiments of the present invention, the at least one electrostatic discharge circuit element is connected between at least one I/O terminal (for example, I/O 1) and at least one power terminal (for example, VDD1, VDD2).

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claimed is:

1. An electrostatic discharge circuit connected between at least three terminals, the electrostatic discharge circuit comprising:
   at least one electrostatic discharge circuit element further including,
      a first switching element connected between a first of the at least three terminals and a second of the at least three terminals, and
      a second switching element connected between the first terminal and a third of the at least three terminals; wherein
         a body of the first switching element is connected to the third terminal,
         a body of the second switching element is connected to the second terminal, and
         one of the second and third terminals is allowed to float such that one of the body of the first switching element and the body of the second switching element is in a floating state.

2. The electrostatic discharge circuit of claim 1, wherein the at least three terminals includes at least one power terminal and at least two ground terminals.

3. The electrostatic discharge circuit of claim 2, wherein the first and second switching elements form a power clamp.

4. The electrostatic discharge circuit of claim 2, further comprising:
   a plurality of power clamps connected between one of the at least one power terminals and two or more of the at least two ground terminals.

5. The electrostatic discharge circuit of claim 4, wherein each of the plurality of power clamps are connected between the same one of the at least one power terminals and the same two or more of the at least two ground terminals.

6. The electrostatic discharge circuit of claim 4, wherein each of the plurality of power clamps are connected between the same one of the at least one power terminals and one of the two or more of the at least two ground terminals.

7. The electrostatic discharge circuit of claim 3, wherein the power clamp is connected between two or more of the at least one power terminals and one of the at least two ground terminals.

8. The electrostatic discharge circuit of claim 3, further comprising:
   a plurality of power clamps connected between two or more of the at least one power terminals and one of the at least two ground terminals.

9. The electrostatic discharge circuit of claim 8, wherein each of the plurality of power clamps are connected between the same one of the at least two ground terminals and the same two or more of the at least one power terminals.

10. The electrostatic discharge circuit of claim 8, wherein each of the plurality of power clamps are connected between the same one of the at least two ground terminals and one of the two or more of the at least one power terminals.

11. The electrostatic discharge circuit of claim 2, wherein the at least one electrostatic discharge circuit element includes at least one pull-down circuit.

12. The electrostatic discharge circuit of claim 11, wherein the at least one pull-down circuit includes a pull-down circuit, connected between one of at least one input/output terminals and two or more of the at least two ground terminals.

13. The electrostatic discharge circuit of claim 12, wherein the electrostatic discharge circuit further comprises a pull-up circuit, connected between one of at least one power terminals and one of the at least one input/output terminals.

14. The electrostatic discharge circuit of claim 11, wherein the at least one pull-down circuit includes a plurality of pull-down circuits connected between a plurality of input/output terminals and two or more of the at least two ground terminals.

15. The electrostatic discharge circuit of claim 14, wherein each of the plurality of pull-down circuits are connected between a different one of the plurality of input/output terminals and the same two or more of the at least two ground terminals.

16. The electrostatic discharge circuit of claim 11, wherein the at least one pull-down circuit includes a plurality of pull-down circuits, each of the plurality of pull-down circuits being connected between a different one of a plurality of input/output terminals and one of the two or more of the at least two ground terminals.

17. The electrostatic discharge circuit of claim 14, wherein the electrostatic discharge circuit further comprises a plurality of pull-up circuits, connected between one of at least one power terminals and the plurality of input/output terminals.

18. The electrostatic discharge circuit of claim 2, wherein the at least one electrostatic discharge circuit element includes at least one pull-up circuit.

19. The electrostatic discharge circuit of claim 18, wherein the at least one pull-up circuit includes a pull-up circuit, connected between one of at least one input/output terminals and two or more of the at least one power terminals.

20. The electrostatic discharge circuit of claim 19, wherein the electrostatic discharge circuit further comprises a pull-down circuit, connected between one of the at least one input/output terminals and one of at least two ground terminals.

21. The electrostatic discharge circuit of claim 18, wherein the at least one pull-up circuit includes a plurality of pull-up circuits between a plurality of input/output terminals and two or more of the at least one power supply terminals.

22. The electrostatic discharge circuit of claim 21, wherein each of the plurality of pull-up circuits are connected between a different one of the plurality of input/output terminals and the same two or more of the at least one power terminals.

23. The electrostatic discharge circuit of claim 18, wherein each of the plurality of pull-up circuits being connected between a different one of a plurality of input/output terminals and one of the two or more of the at least one power terminals.

24. The electrostatic discharge circuit of claim 21, wherein the electrostatic discharge circuit further comprises a plurality of pull-down circuits connected between the plurality of input/output terminals and one of the at least two ground terminals.

25. The electrostatic discharge circuit of claim 1, wherein the at least one electrostatic discharge circuit element includes at least one pull-down circuit and at least one pull-up circuit.

26. The electrostatic discharge circuit of claim 25, wherein the at least one pull-down circuit includes a pull-down circuit connected between one of at least one input/output terminals and two or more of the at least two ground terminals.

27. The electrostatic discharge circuit of claim 25, wherein the at least one pull-down circuit includes a plurality of pull-down circuits connected between a plurality of input/output terminals and two or more of the at least two ground terminals.

28. The electrostatic discharge circuit of claim 1, wherein the at least three terminals include at least two power terminals, the electrostatic discharge circuit further comprising:
a transfer circuit connected between the at least two power terminals, the transfer circuit being configured to transfer charge from a first of the at least two power terminals to a second of the at least two power terminals during an ESD event.

29. The electrostatic discharge circuit of claim 25, wherein the at least one pull-up circuit includes a pull-up circuit, connected between one of at least one input/output terminals and two or more of the at least one power terminals.

30. The electrostatic discharge circuit of claim 25, wherein the at least one pull-up circuit includes a plurality of pull-up circuits connected between plurality of input/output terminals and two or more of the at least one power terminals.

* * * * *